(12) United States Patent
Sezginer et al.

(10) Patent No.: US 6,819,426 B2
(45) Date of Patent: Nov. 16, 2004

(54) OVERLAY ALIGNMENT METROLOGY USING DIFFRACTION GRATINGS

(75) Inventors: Abdurrahman Sezginer, Los Gatos, CA (US); Kenneth C. Johnson, Santa Clara, CA (US); Fred E. Stanke, Cupertino, CA (US)

(73) Assignee: Therma-Wave, Inc., Fremont, CA (US)

( * ) Notice: Subject to any disclaimer, the term of this patent is extended or adjusted under 35 U.S.C. 154(b) by 254 days.

(21) Appl. No.: 10/074,561

(22) Filed: Feb. 12, 2002

(65) Prior Publication Data

US 2002/0158193 A1 Oct. 31, 2002

Related U.S. Application Data

(60) Provisional application No. 60/322,219, filed on Sep. 14, 2001, provisional application No. 60/295,111, filed on Jun. 1, 2001, and provisional application No. 60/268,485, filed on Feb. 12, 2001.

(51) Int. Cl.[7] .................................... G01B 11/00
(52) U.S. Cl. ........................... 356/401; 356/400
(58) Field of Search ................ 356/400–401; 422/22, 30

(56) References Cited

U.S. PATENT DOCUMENTS

| | | | |
|---|---|---|---|
| 4,103,998 A | 8/1978 | Nakazawa et al. | 356/152 |
| 4,172,664 A | 10/1979 | Charsky et al. | 356/356 |
| 4,200,395 A | 4/1980 | Smith et al. | 356/356 |
| 4,311,389 A | 1/1982 | Fay et al. | 356/354 |
| 4,332,473 A | 6/1982 | Ono | 356/356 |

(List continued on next page.)

FOREIGN PATENT DOCUMENTS

| | | | | |
|---|---|---|---|---|
| EP | 0 281 030 | 2/1988 | ........... | G03B/41/00 |
| EP | 0 192 656 B1 | 5/1990 | ........... | G01B/11/06 |
| EP | 0 965 889 A2 | 12/1999 | ............ | G03F/9/00 |
| JP | 62157295 | 6/1987 | ........... | H01L/21/30 |
| WO | WO99/45340 | 9/1999 | | |
| WO | WO 99/45340 | 9/1999 | ........... | G01B/11/02 |
| WO | WO 00/72093 A1 | 11/2000 | ............ | G03F/9/00 |
| WO | WO 02/25723 A2 | 3/2002 | ........... | H01L/21/66 |

OTHER PUBLICATIONS

T.K. Gaylord et al., "Analysis and Applications of Optical Diffraction by Gratings," *Proc. IEEE,* vol. 73, No. 5, 1985, pp. 894–937.

M.G. Moharam et al., "Stable implementation of the rigorous coupled–wave analysis for surface–relief gratings: enhanced transmittance matrix approach." *J. Opt. Soc. Am. A,* vol. 12, No. 5, May 1995, pp. 1077–1086.

M.G. Moharam et al., "Rigorous coupled–wave analysis of planar–grating diffraction," *J. Opt. Soc. Am.,* vol. 71, No. 7, Jul. 1981, pp. 811–818.

(List continued on next page.)

*Primary Examiner*—Zandra V. Smith
(74) *Attorney, Agent, or Firm*—Stallman & Pollock LLP

(57) ABSTRACT

Alignment accuracy between two or more patterned layers is measured using a metrology target comprising substantially overlapping diffraction gratings formed in a test area of the layers being tested. An optical instrument illuminates all or part of the target area and measures the optical response. The instrument can measure transmission, reflectance, and/or ellipsometric parameters as a function of wavelength, polar angle of incidence, azimuthal angle of incidence, and/or polarization of the illumination and detected light. Overlay error or offset between those layers containing the test gratings is determined by a processor programmed to calculate an optical response for a set of parameters that include overlay error, using a model that accounts for diffraction by the gratings and interaction of the gratings with each others' diffracted field. The model parameters might also take account of manufactured asymmetries. The calculation may involve interpolation of pre-computed entries from a database accessible to the processor. The calculated and measured responses are iteratively compared and the model parameters changed to minimize the difference.

31 Claims, 25 Drawing Sheets

U.S. PATENT DOCUMENTS

| | | | |
|---|---|---|---|
| 4,703,434 A | 10/1987 | Brunner | 364/488 |
| 4,757,207 A | 7/1988 | Chappelow et al. | 250/491.1 |
| 5,100,237 A | 3/1992 | Wittekoek et al. | 356/401 |
| 5,343,292 A | 8/1994 | Brueck et al. | 356/363 |
| 5,608,526 A | 3/1997 | Piwonka-Corle et al. | 356/369 |
| 5,712,707 A | 1/1998 | Ausschaitl et al. | 356/401 |
| 5,721,607 A | 2/1998 | Ota | 355/53 |
| 5,795,687 A | 8/1998 | Yasuda | 430/22 |
| 5,805,290 A | 9/1998 | Ausschaitl et al. | 356/401 |
| 5,808,742 A | 9/1998 | Everett et al. | 356/363 |
| 5,867,276 A | 2/1999 | McNeil et al. | 356/445 |
| 5,889,593 A | 3/1999 | Bareket | 356/445 |
| 5,963,329 A | 10/1999 | Conrad et al. | 356/372 |
| 6,023,338 A | 2/2000 | Bareket | 356/401 |
| 6,079,256 A | 6/2000 | Bareket | 73/105 |
| 6,088,103 A | 7/2000 | Everett et al. | 356/355 |
| 6,100,985 A | 8/2000 | Scheiner et al. | 356/381 |
| 6,130,750 A | 10/2000 | Ausschaitl et al. | 356/401 |
| 6,150,231 A | 11/2000 | Muller et al. | 438/401 |
| 6,436,595 B1 * | 8/2002 | Credendino et al. | 430/22 |
| 6,440,612 B1 * | 8/2002 | Baggenstoss | 430/5 |
| 6,458,605 B1 | 10/2002 | Stirton | 438/7 |
| 2003/0190793 A1 | 10/2003 | Brill et al. | 438/401 |

OTHER PUBLICATIONS

C.J. Raymond et al., "Scatterometry for CD measurements of etched structures," *Proceedings of the SPIE, SPIE, Bellingham, VA (U.S.A.)*, vol. 2725, 1996, pp. 720–728.

M.R. Murnane et al., "Developed photoresist metrology using scatterometry," *Proceedings of the SPIE, SPIE, Bellingham, VA (U.S.A.)*, vol. 2196, 1994, pp. 47–59.

C.J. Raymond et al., "Metrology of subwavelength photoresist gratings using optical scatterometry," *Journal of Vacuum Science & Technology B*, vol. 13, No. 4, Jul. 1, 1995. pp. 1484–1495.

N. T. Sullivan et al., "Semiconductor Pattern Overlay", Handbook of Critical Dimension Metrology and Process Control, Proceedings of Conf. Sep. 28–29, 1993, Monterey, CA, K.M. Monahan, *SPIE Optical Engineering Press*, vol. CR52, pp. 160–188.

Printout, Nikon KrF Step–and–Repeat Scanning System NSR–S205C, Jul. 2000.

A. Starikov et al., "Accuracy of Overlay Measurements: Tool and mark Asymmetry Effects", *Optical Engineering*, Jun. 1992, vol. 31, No. 6, pp. 1298–1310.

J. Opsal et al., "Broadband Spectral Operation of a Rotating–Compensator Ellipsometer", *Thin Solid Films*, 1998, vol. 313–314, pp. 58–61.

X. Niu et al., "Specular Spectroscopic Scatterometry in DUV Lithography", *SPIE*, Mar. 1999, vol. 3677, pp. 159–168.

R.M. Silver et al., "Overlay Metrology: Recent Advances and Future Solutions", *Future Fab International*, Issue 11, London, Jul. 2001, 17 pages.

IBM Technical Disclosure Bulletin, Mar. 1990, 90A 60854/ GE8880210, pp. 170–174.

C.C. Baum et al., "Scatterometry for Post–etch Polysilicon Gate Metrology", *Part of the SPIE Conference on Metrology, Inspection and Process Control for Microlithography XIII, Santa Clara, CA*, Mar. 1999, SPIE vol. 3677, pp. 148–158.

J. Bischoff et al., "Single feature metrology by means of light scatter analysis", *SPIE*, vol. 3050 (1997), pp. 574–585.

J. Bischoff et al., "Diffraction analysis based characterization of very fine gratings", *SPIE*, vol. 3099 (1997), pp. 212–222.

J. Bischoff et al., "New aspects of optical scatterometry applied to microtechnology", *SPIE*, vol. 3215 (1997), pp. 144–155.

J. Bischoff et al., "Modeling of optical scatterometry with finite–number–of–periods gratings", *Part of the EUROPTO Conference on In–Line Characterization Techniques for Performance and Yield Enhancement in Microelectronic Manufacturing, Edinburgh, Scotland*, May 1999, SPIE vol. 3743, pp. 41–48.

J. Bischoff et al., "Characterization of 3D resist patterns by means of optical scatterometry", *Part of the EUROPTO Conference on in–Line Characterization Techniques for Performance and Yield Enhancement in Microelectronic Manufacturing, Edinburgh, Scotland*, May 1999, SPIE vol. 3743, pp. 49–60.

J. Bischoff et al., "Light Diffraction Based Overlay Measurement", *Metrology, Inspection, and Process Control for Microlithography XV*, SPIE vol. 4344 (2001), pp. 222–233.

T. Bosworth et al., "Critical–dimension and overlay metrology: a reivew", *Solid State Technology*, Sep. 1995, pp. 119–123.

"Method for Measuring Semiconductor Lighographic Tool Focus and Exposure", *IBM Technical Disclosure Bulletin*, Jul. 1987, pp. 516–518.

"Interferometric Method of Checking the Overlay Accuracy in Photolithographic Exposure Processes" *IBM Technical Disclosure Bulletin*, vol. 32, No. 10B, Mar. 1990, pp. 214–217.

"Phase–Sensitive Overlay Analysis Spectrometry", *IBM Technical Disclosure Bulletin*, vol. 32, No. 10A, Mar. 1990, pp. 170–174.

"Interferometric Measurement System for Overlay Measurement in Lithographic Processes", *IBM Technical Disclosure Bulletin*, Feb. 1994, pp. 535–536.

"Interferometric Method of Checking the Overlay Accuracy in Photolitho Graphic Exposure Processes", *IBM Technical Disclosure Bulletin*, Mar. 1990, pp. 214–217.

P. Heimann, "The Color–Box alignment vernier: a sensitive lithographic alignment vernier read at low magnification", *Optical Engineering*, Jul. 1990, vol. 29, No. 7, pp. 828–836.

"Layer Alignment/Overlay: Optical Diffraction", Nerac.com Retro Search, NERAC Inc., Apr. 19, 2002, 93 pages in length.

"Lateral Shift: Optical Methods/Techniques", Nerac.com Retro Search, NERAC Inc., Apr. 19, 2002, 90 pages in length.

"Scatterometry and Overlay", Nerac.com Retro Search, NERAC Inc., Apr. 19, 2002, 8 pages.

N. Blayo et al., "Ultraviolet–visible ellipsometry for process control during the etching of submicrometer features", *J. Opt. Soc. Am. A*, vol. 12, No. 3, Mar. 1995, pp. 591–599.

S. Sohail et al., "Optical Scatterometry for Process Metrology", SPIE vol. CR 72 (1999), pp. 129–143.

* cited by examiner

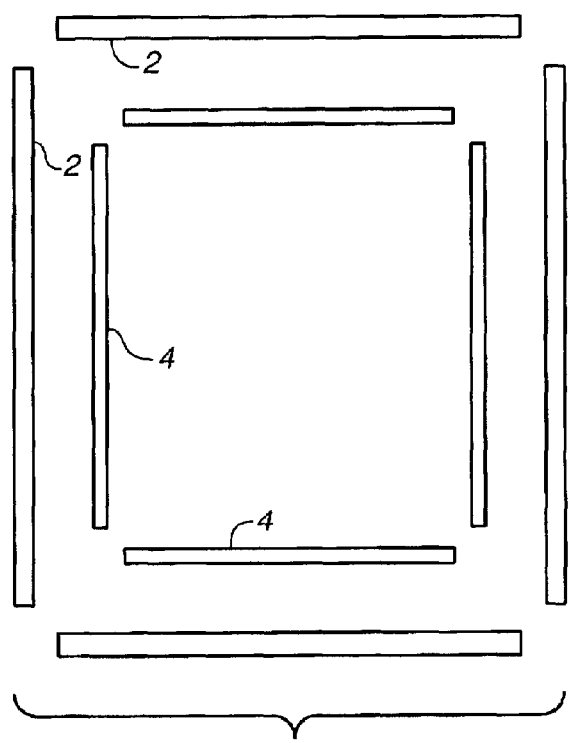
FIG._1
(PRIOR ART)
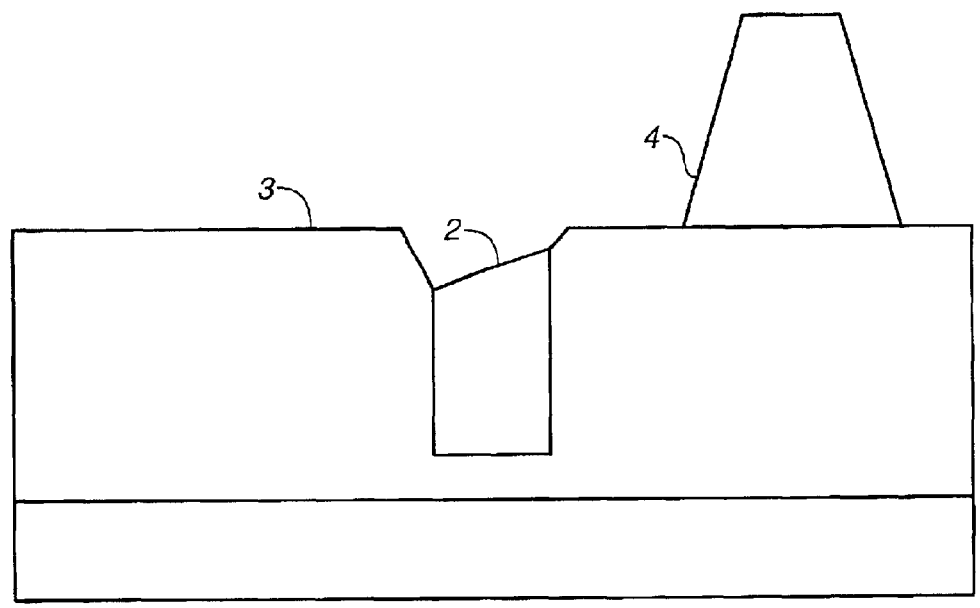
FIG._2
(PRIOR ART)

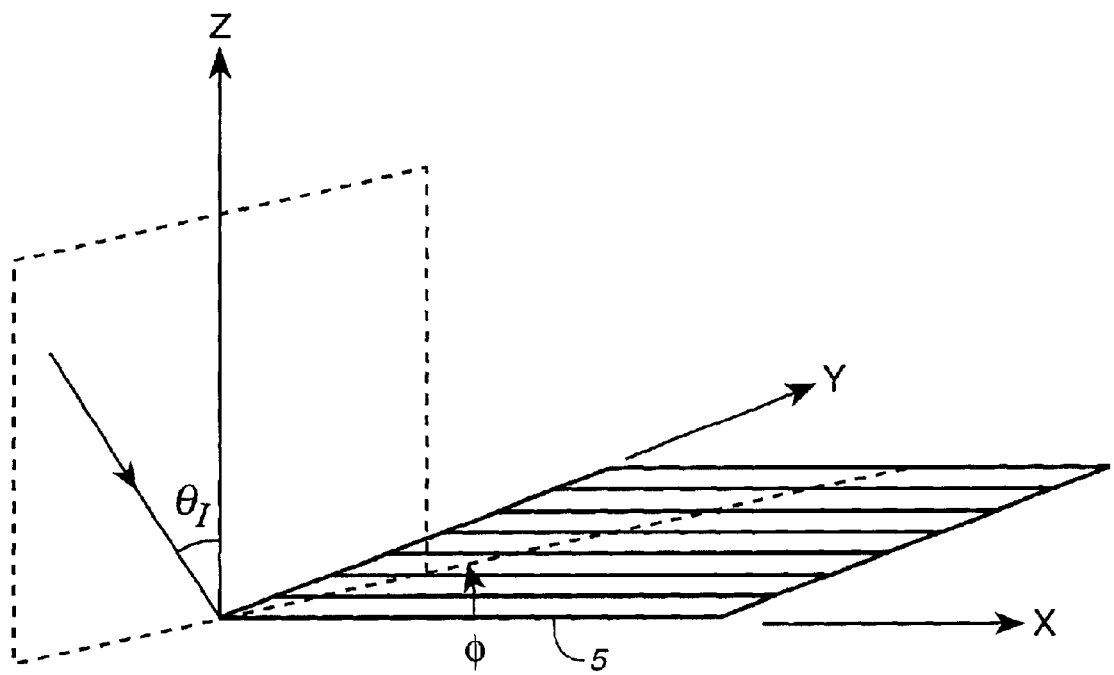
FIG._3
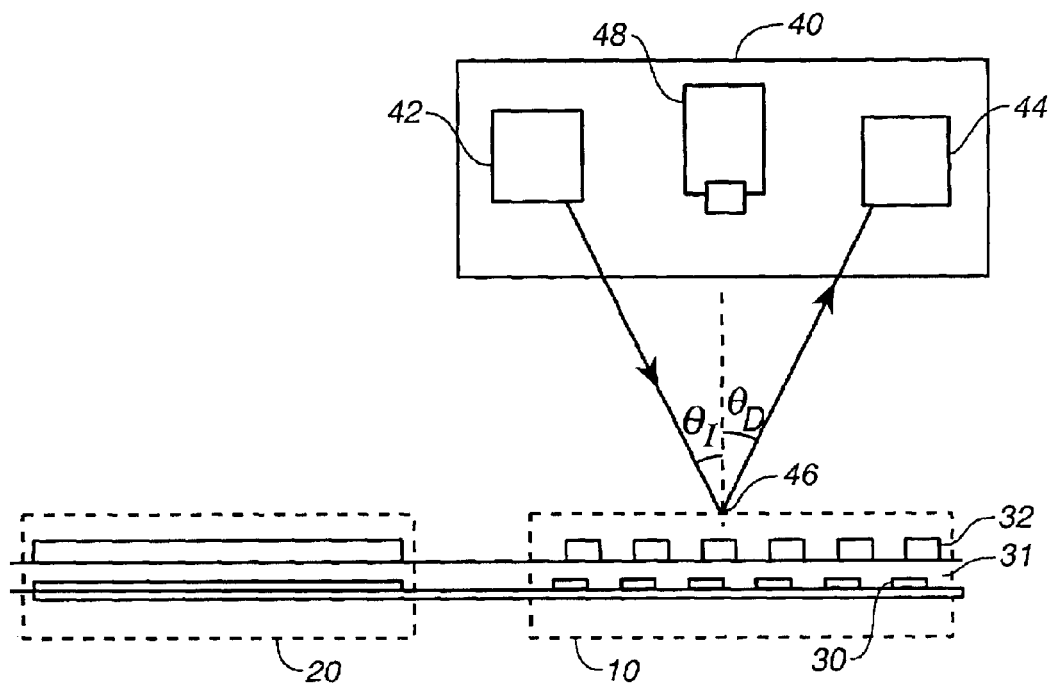
FIG._4

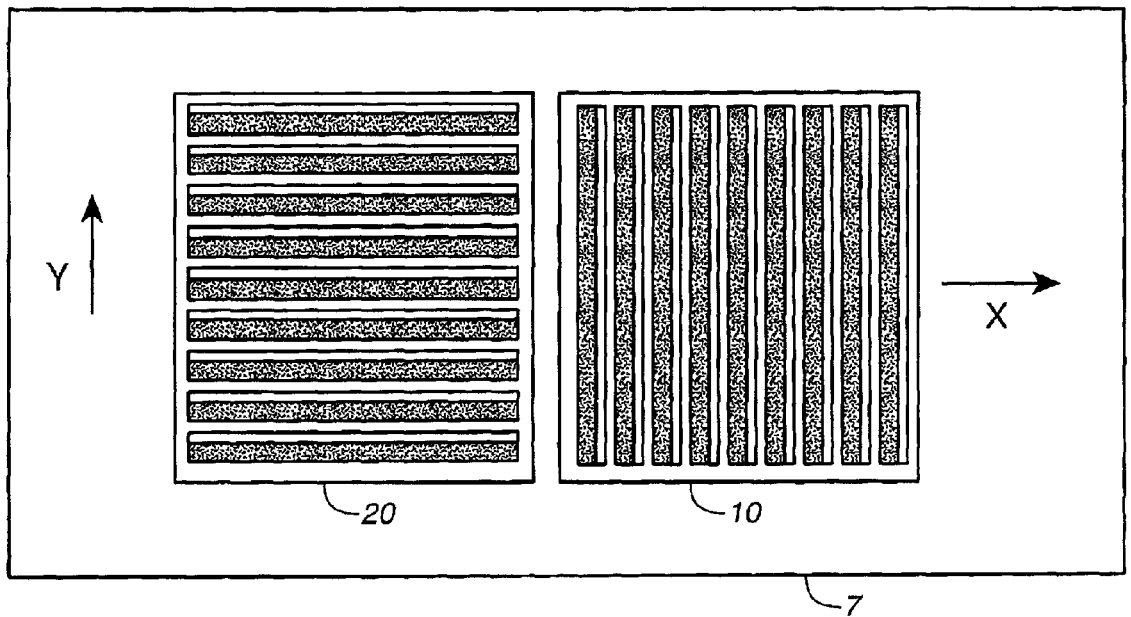
FIG._5
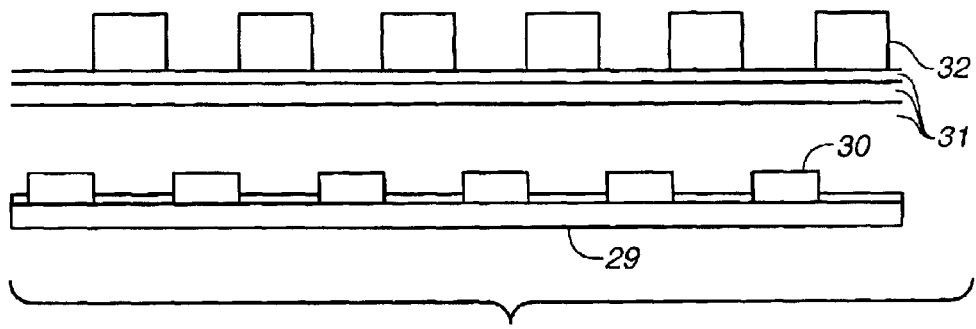
FIG._6
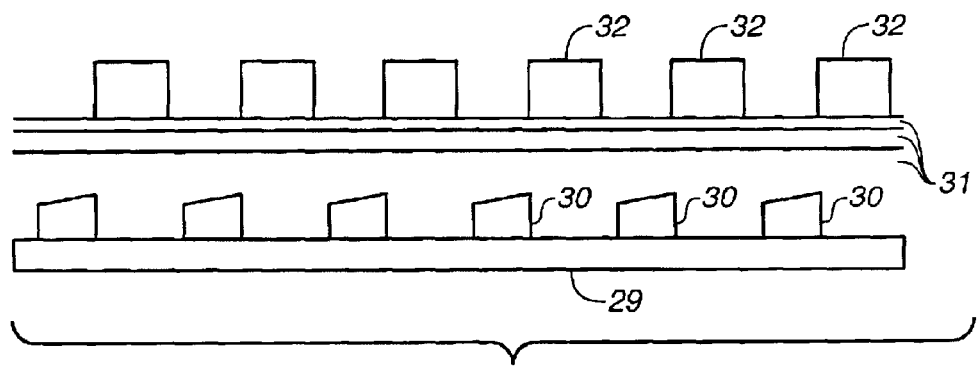
FIG._7

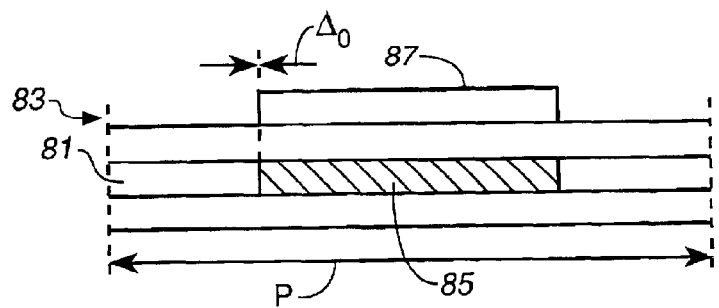
*FIG._8a*
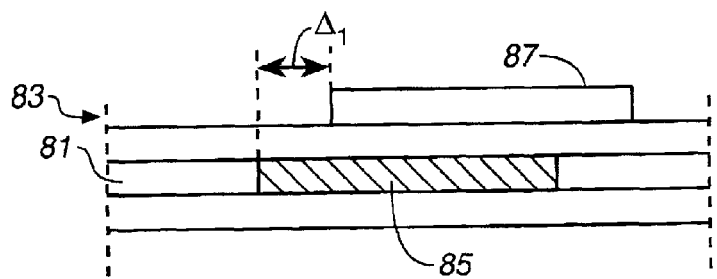
*FIG._8b*
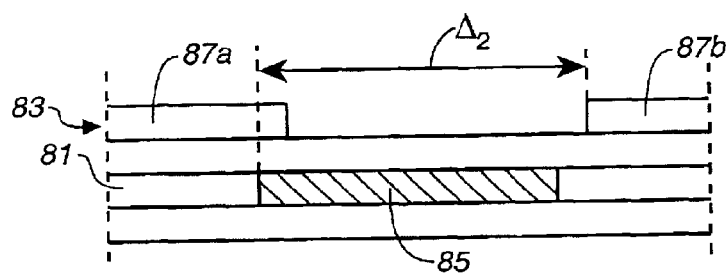
*FIG._8c*
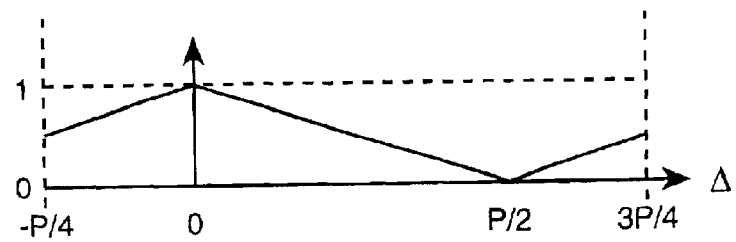
*FIG._8d*

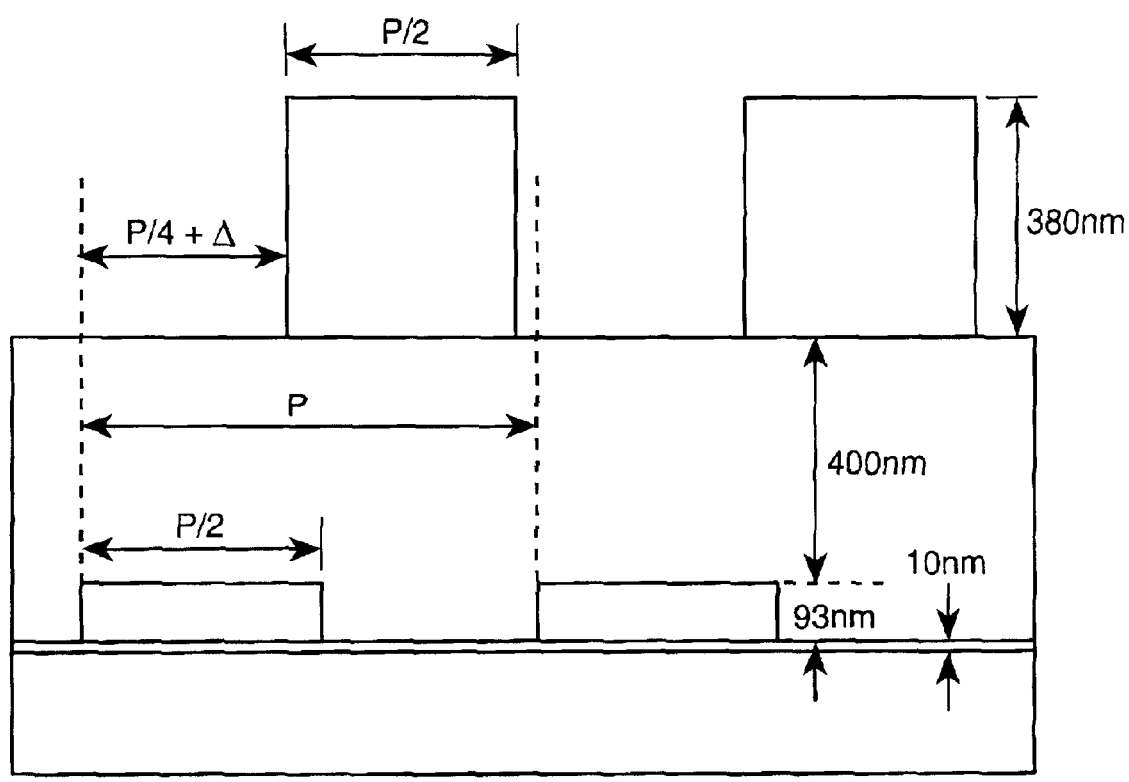
FIG._9

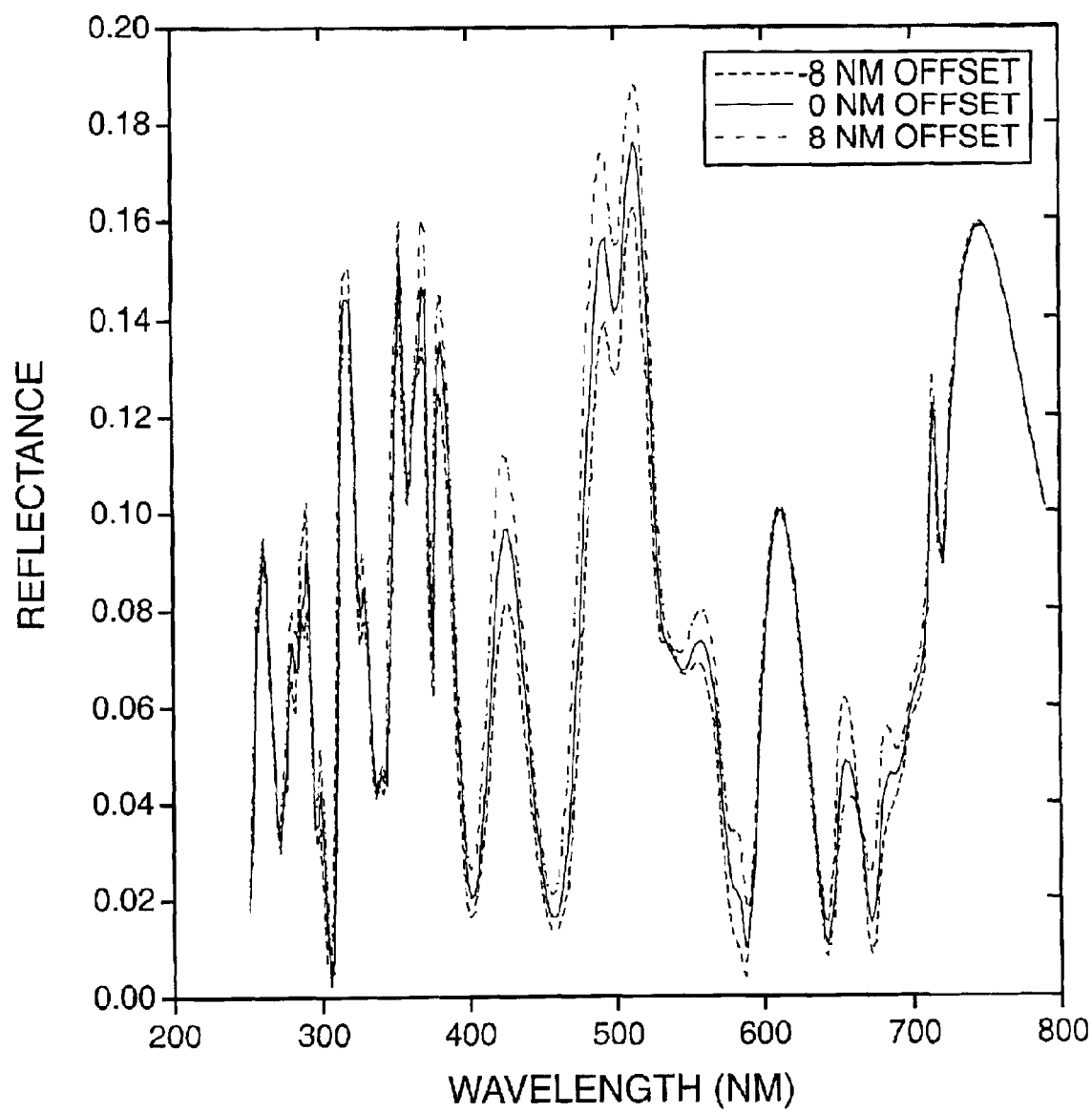
*FIG._10a*

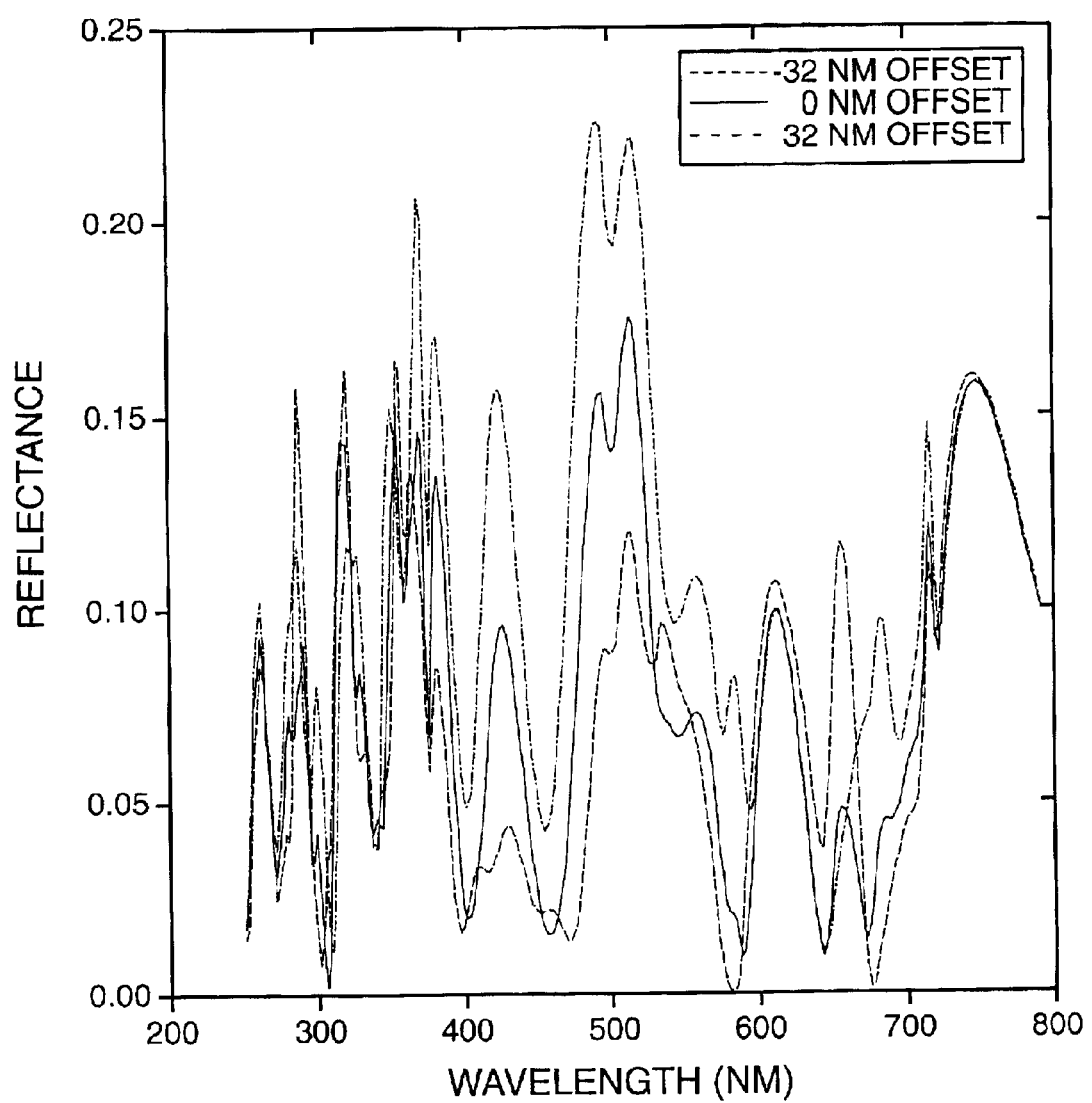
FIG._10b

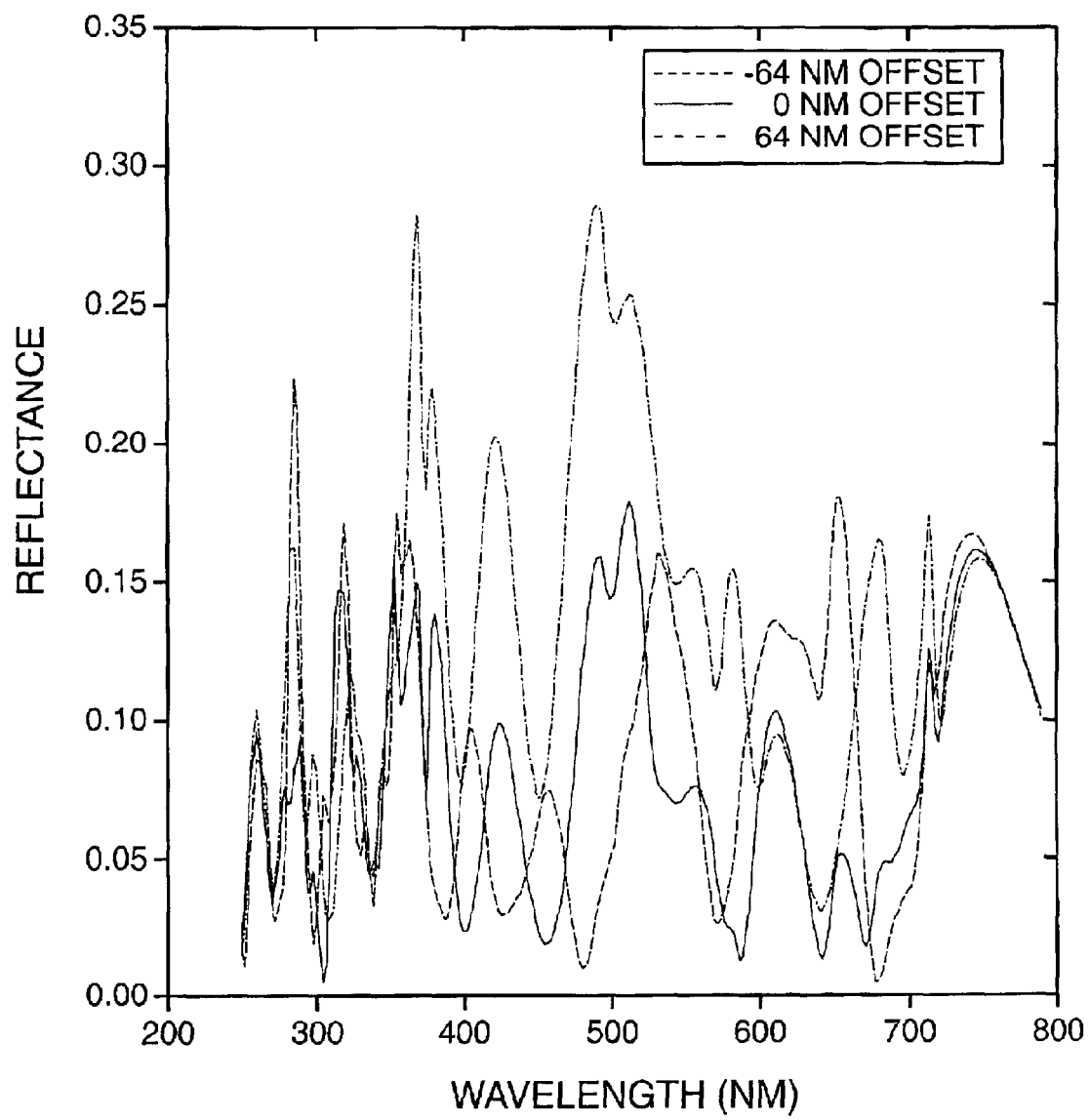
FIG._10c

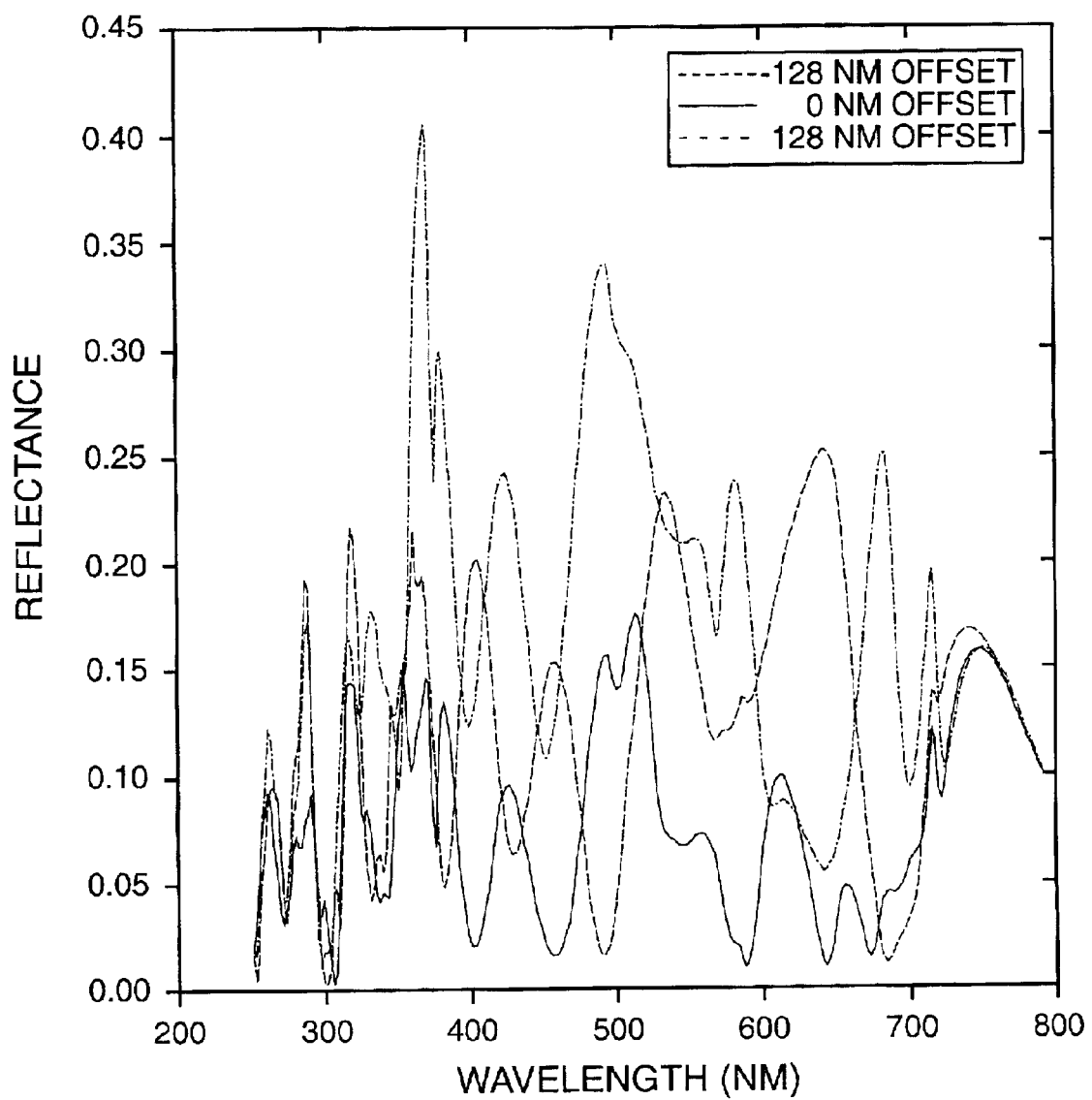
FIG._10d

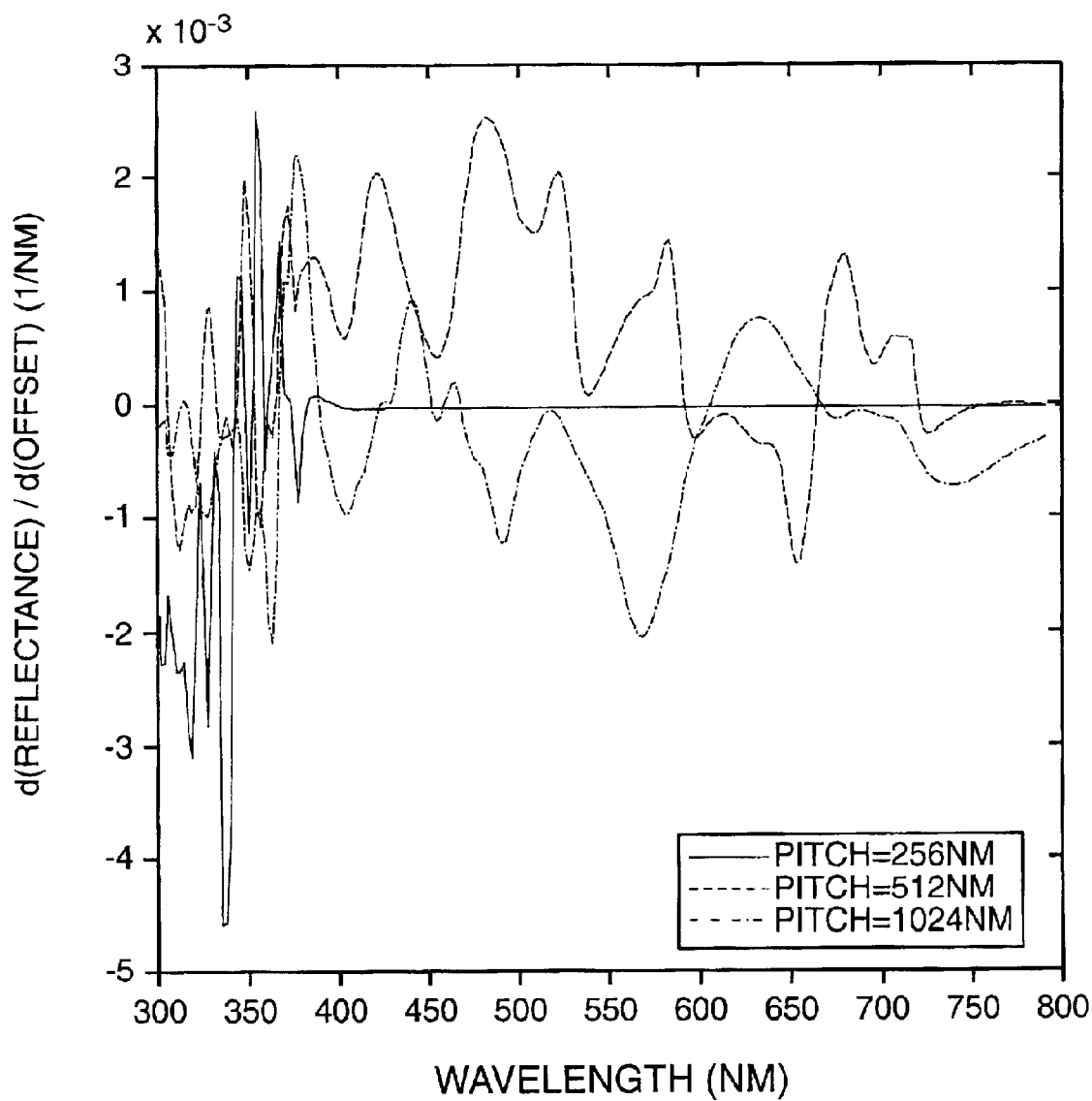
FIG._11

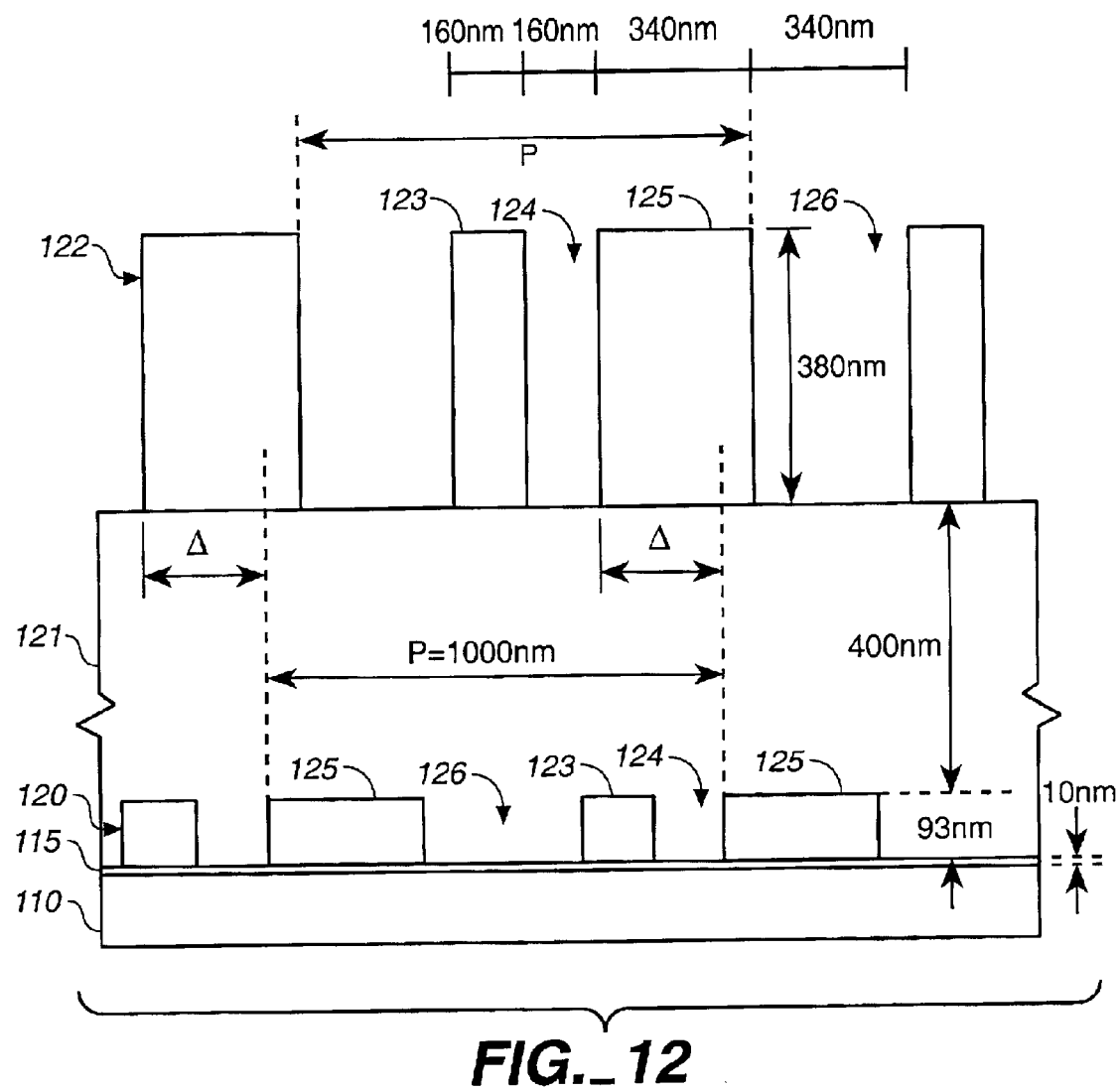
FIG._12

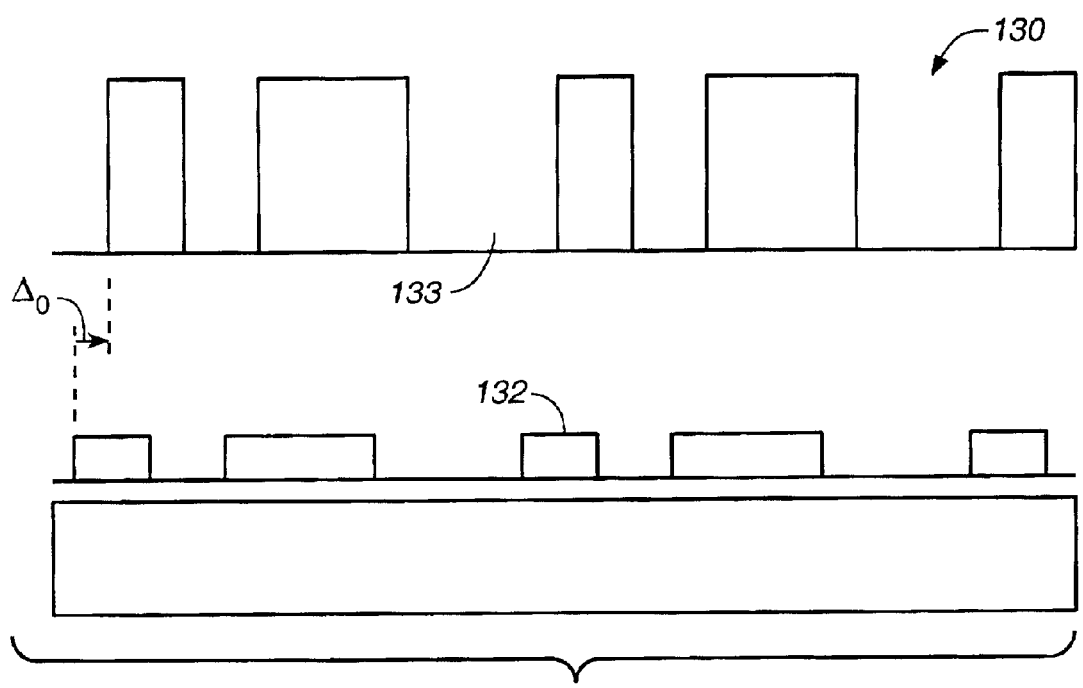
FIG._13a
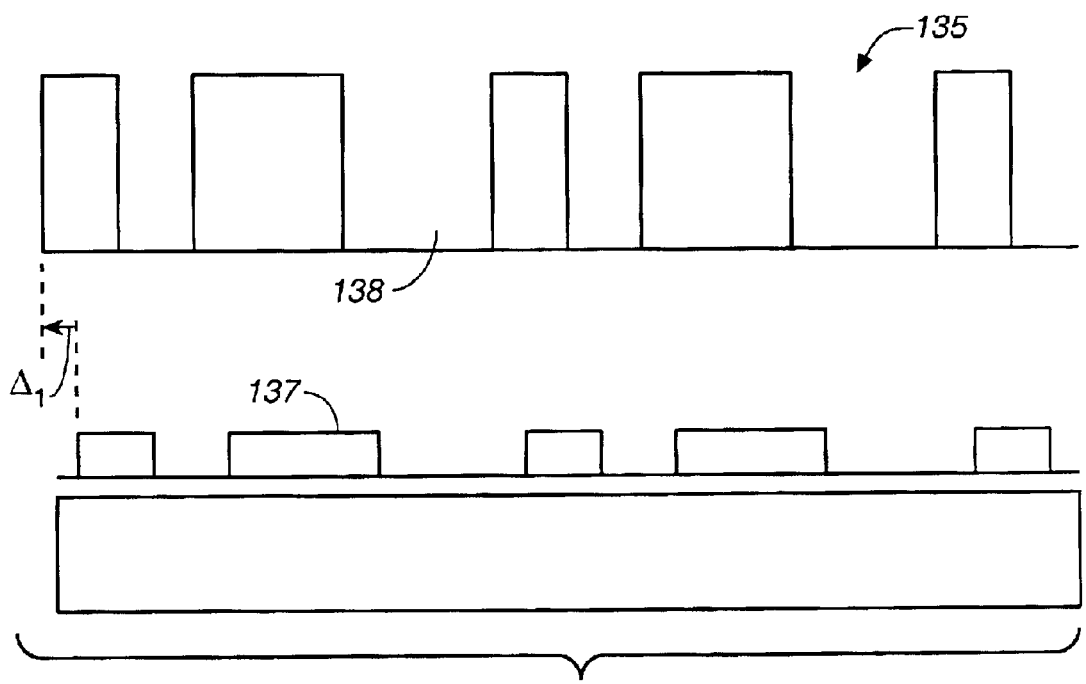
FIG._13b

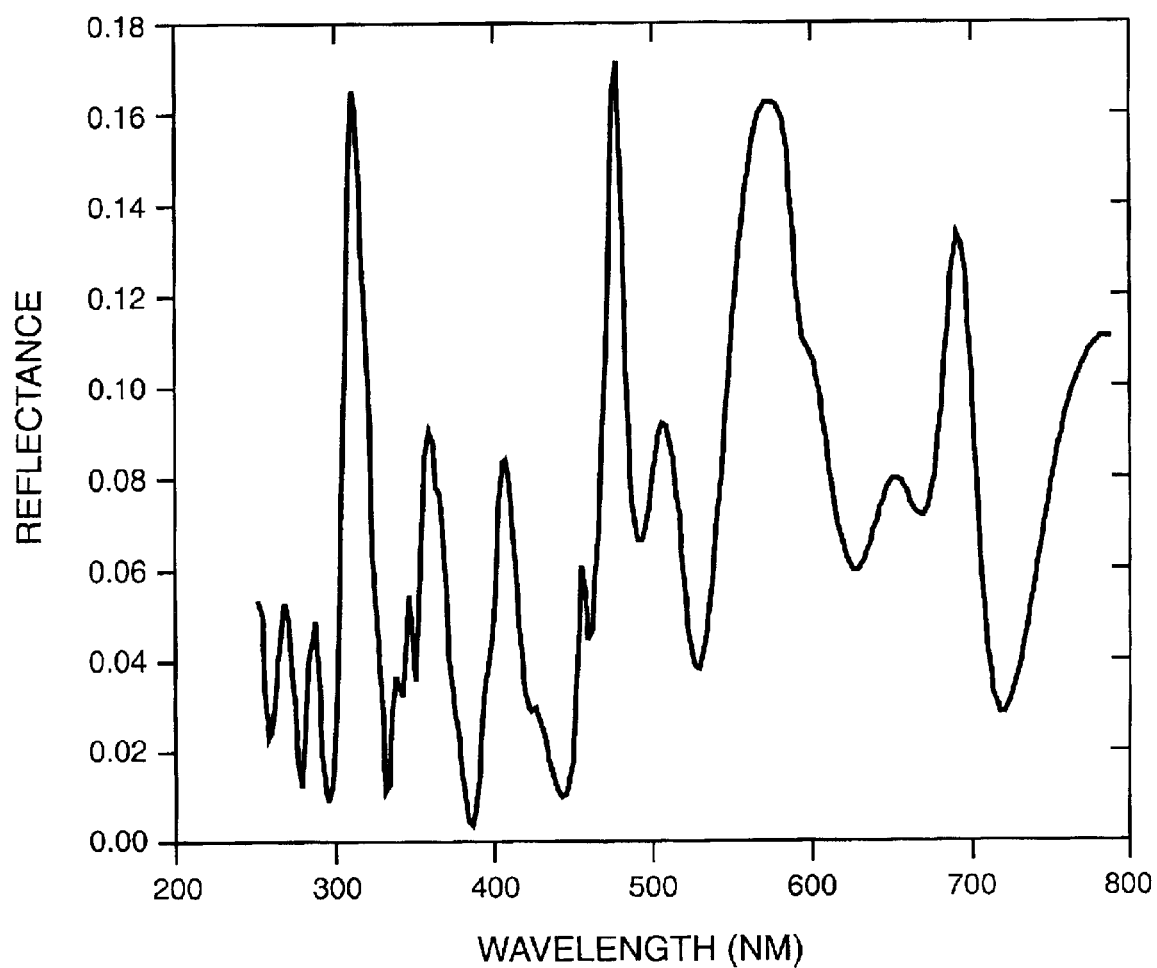
FIG._14

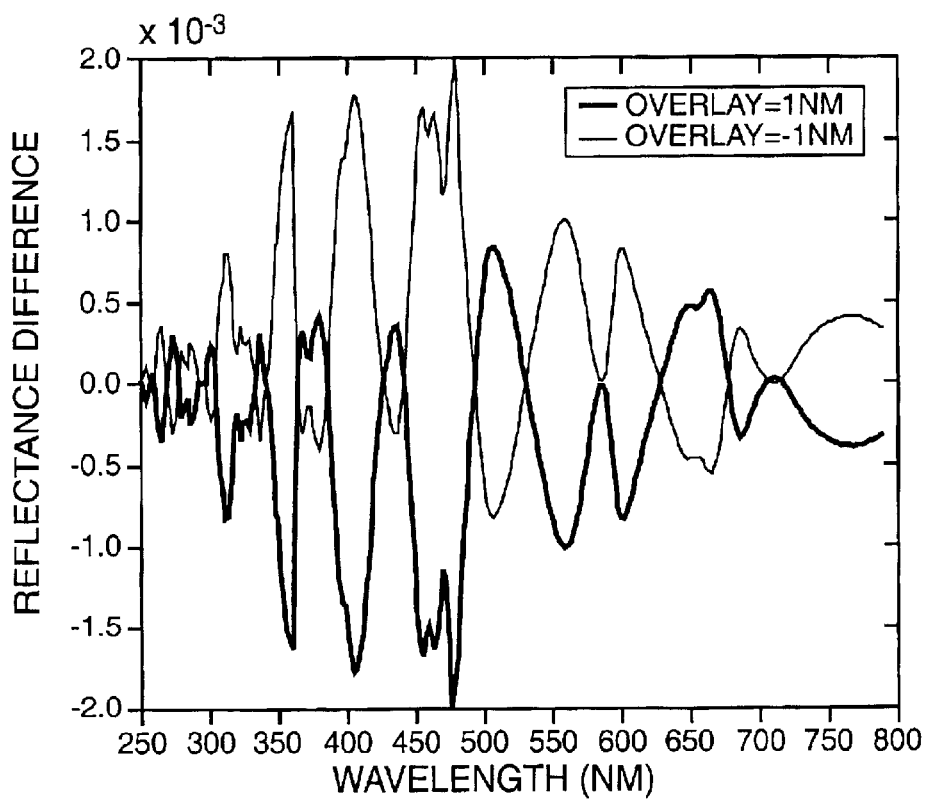
FIG._15a
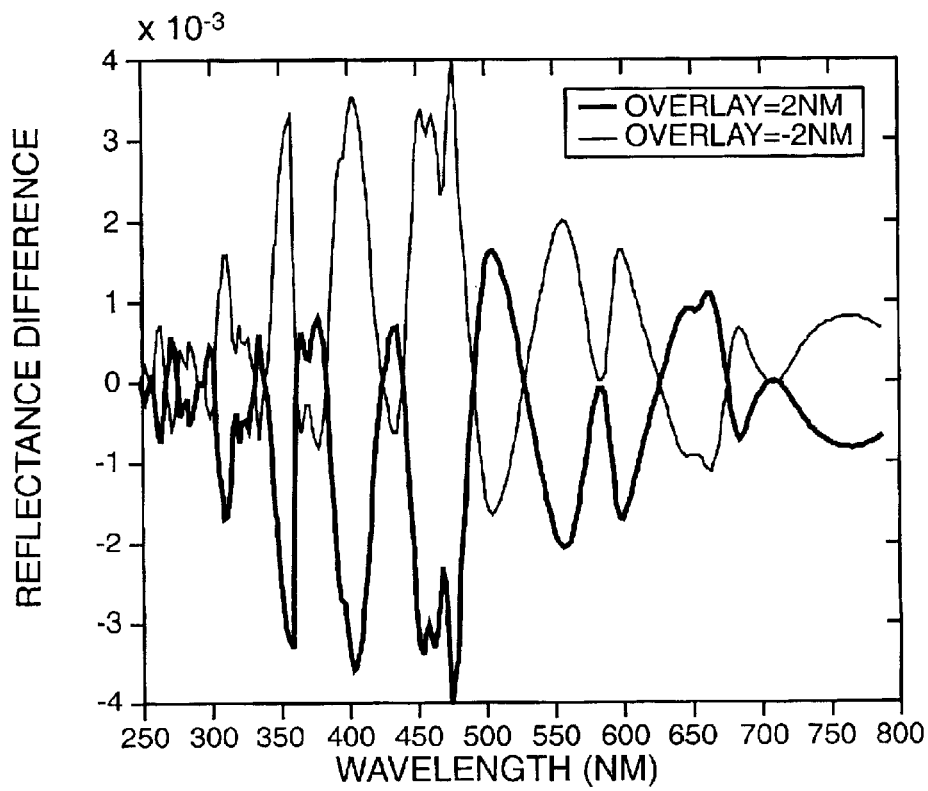
FIG._15b

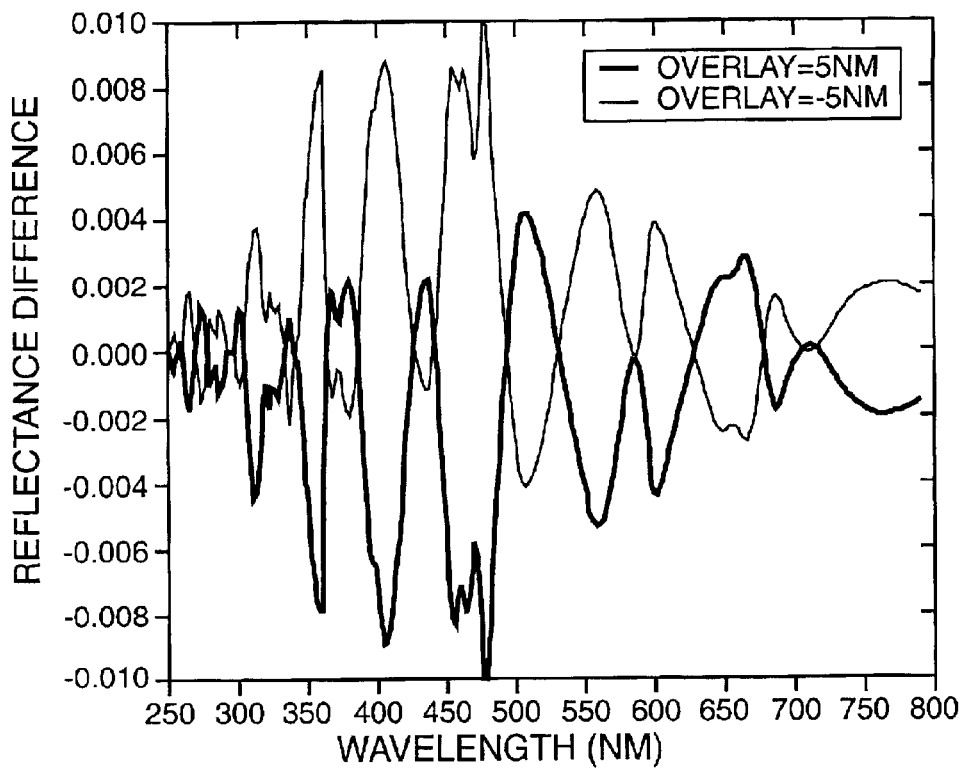
FIG._15c
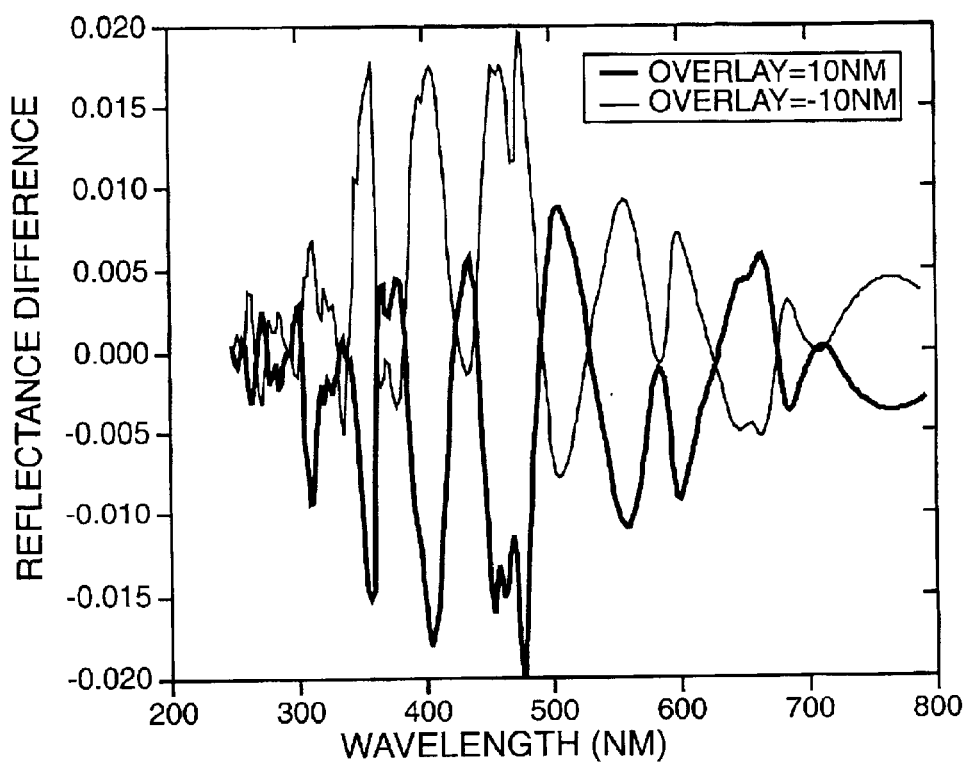
FIG._15d

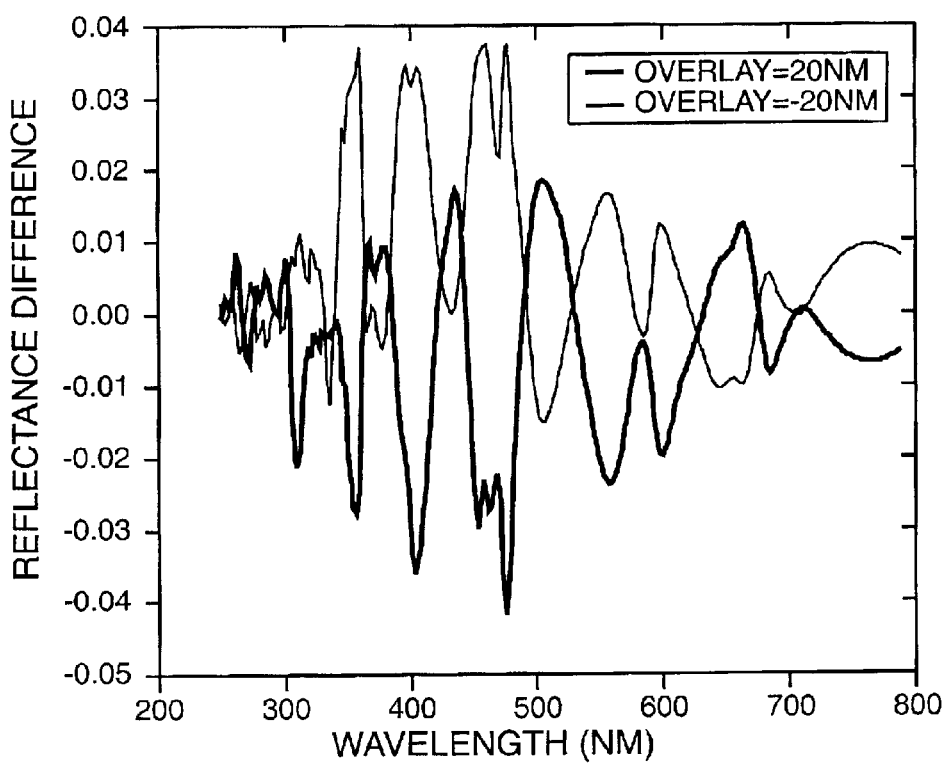
FIG._15e
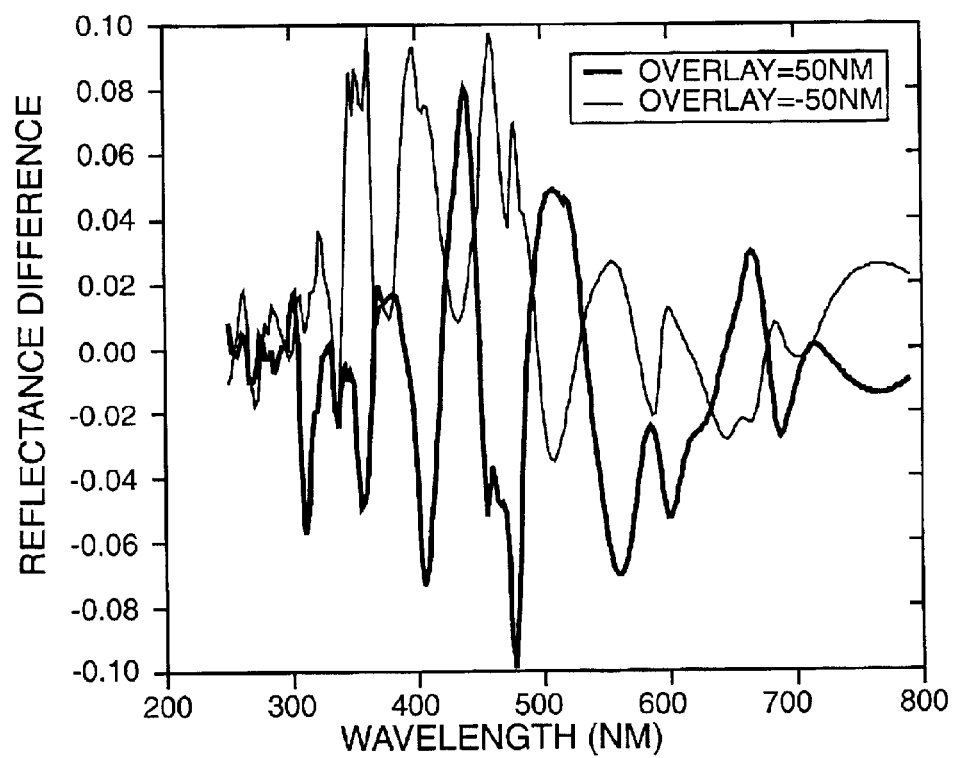
FIG._15f

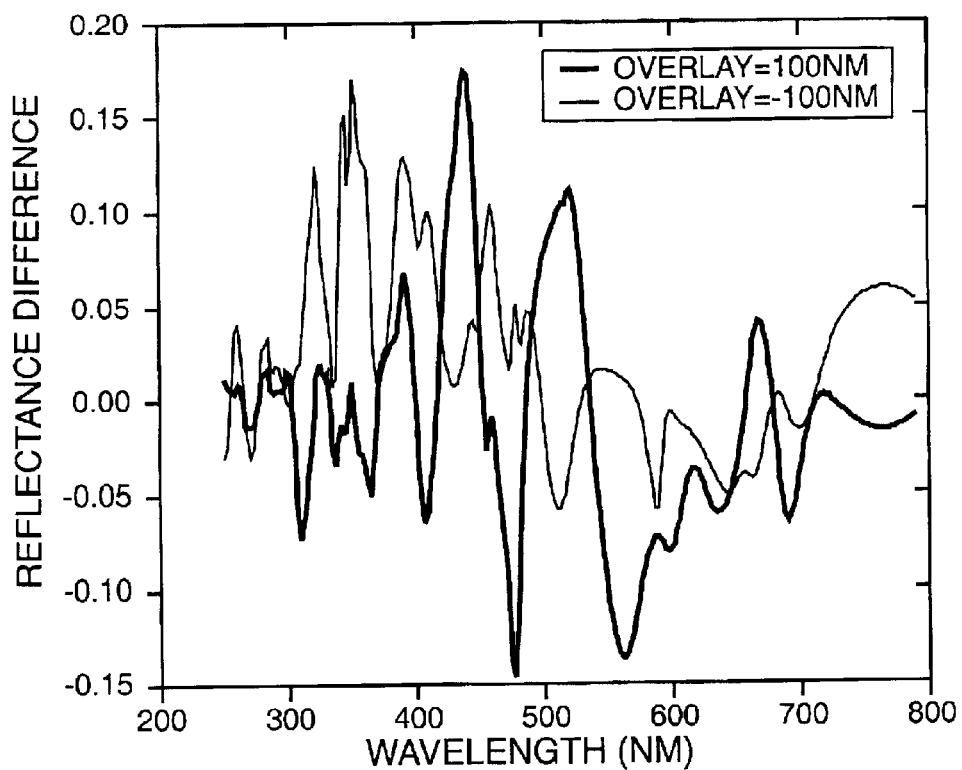
FIG._15g
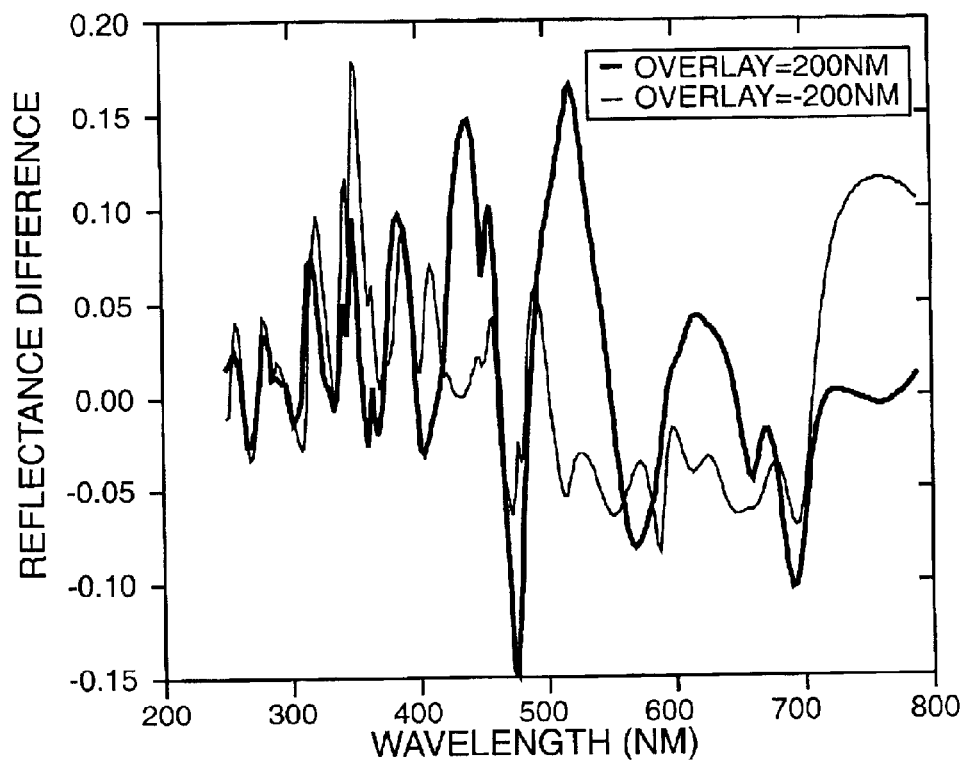
FIG._15h

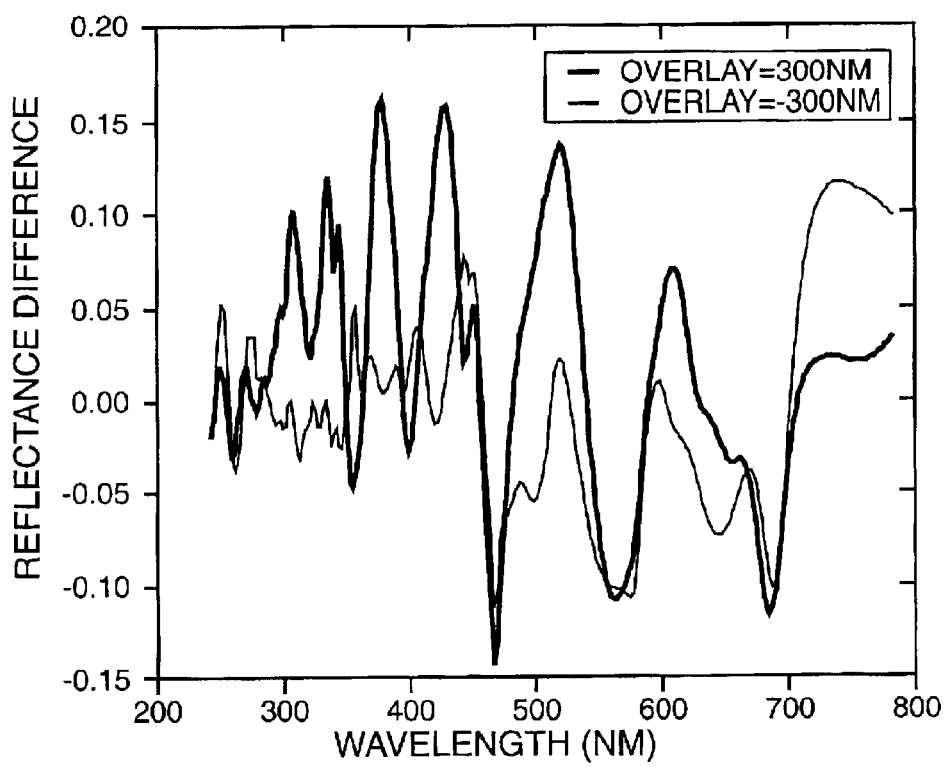
FIG._15i
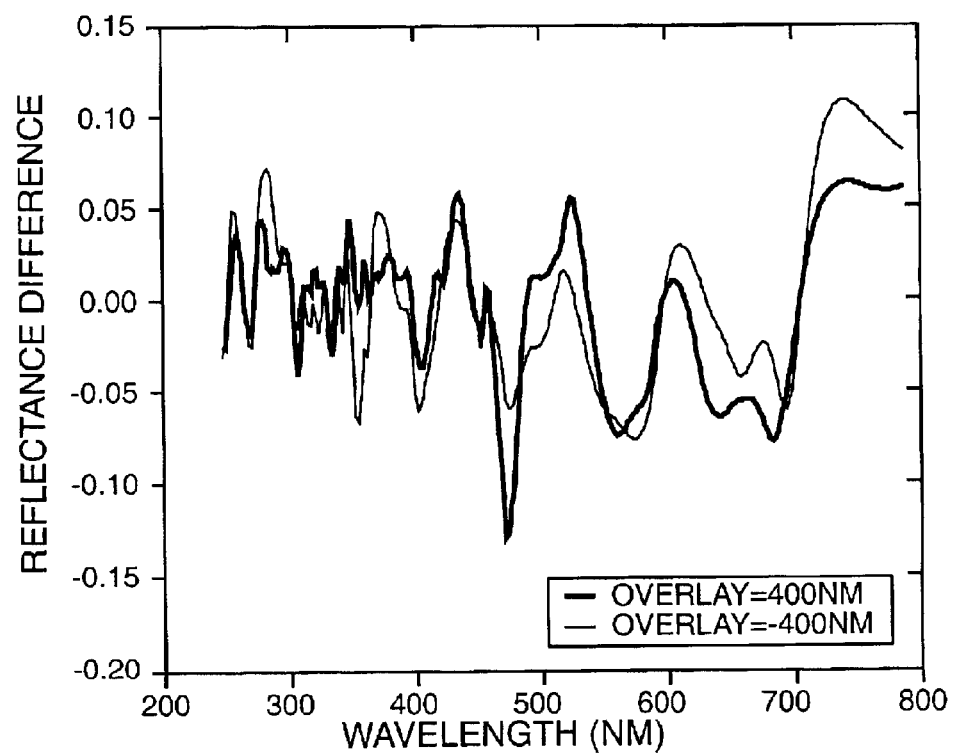
FIG._15j

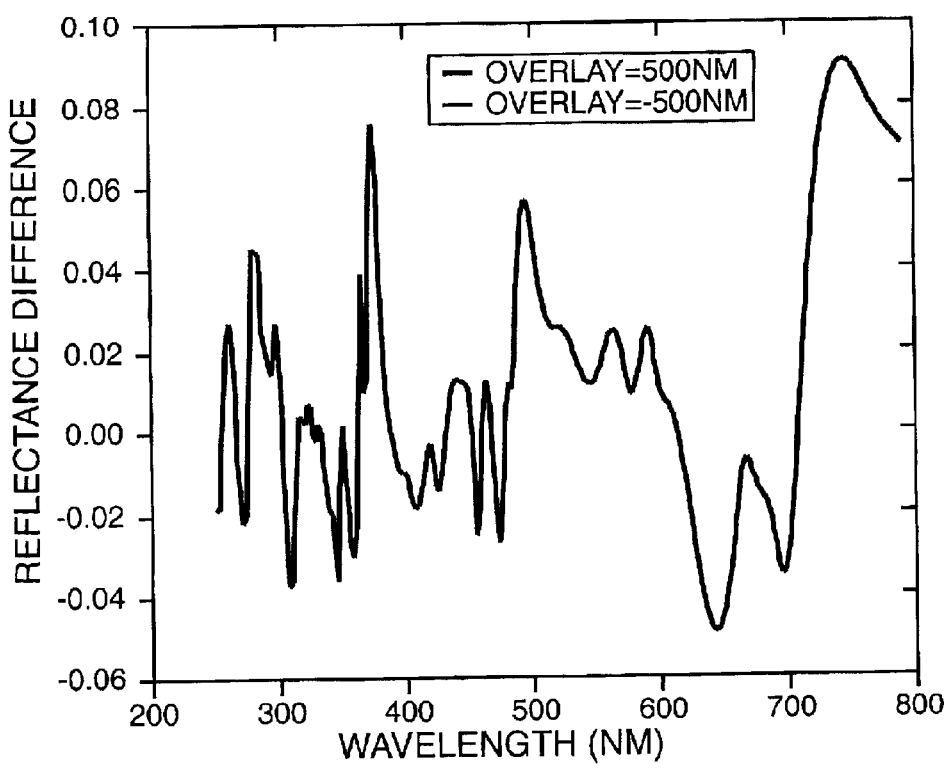
FIG._15k
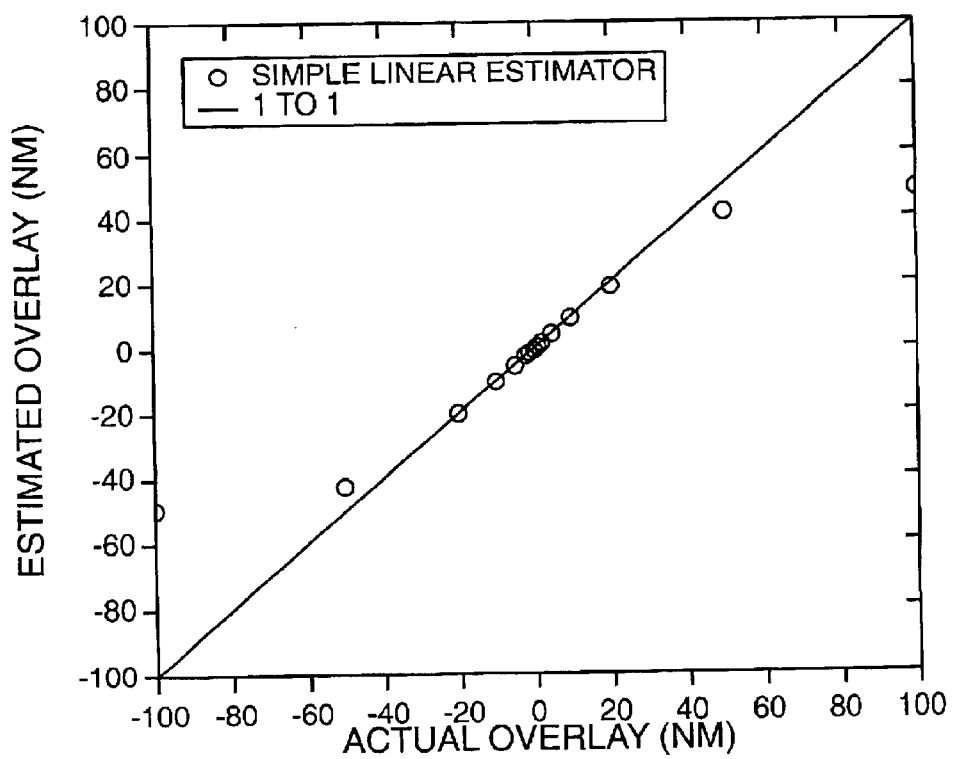
FIG._16

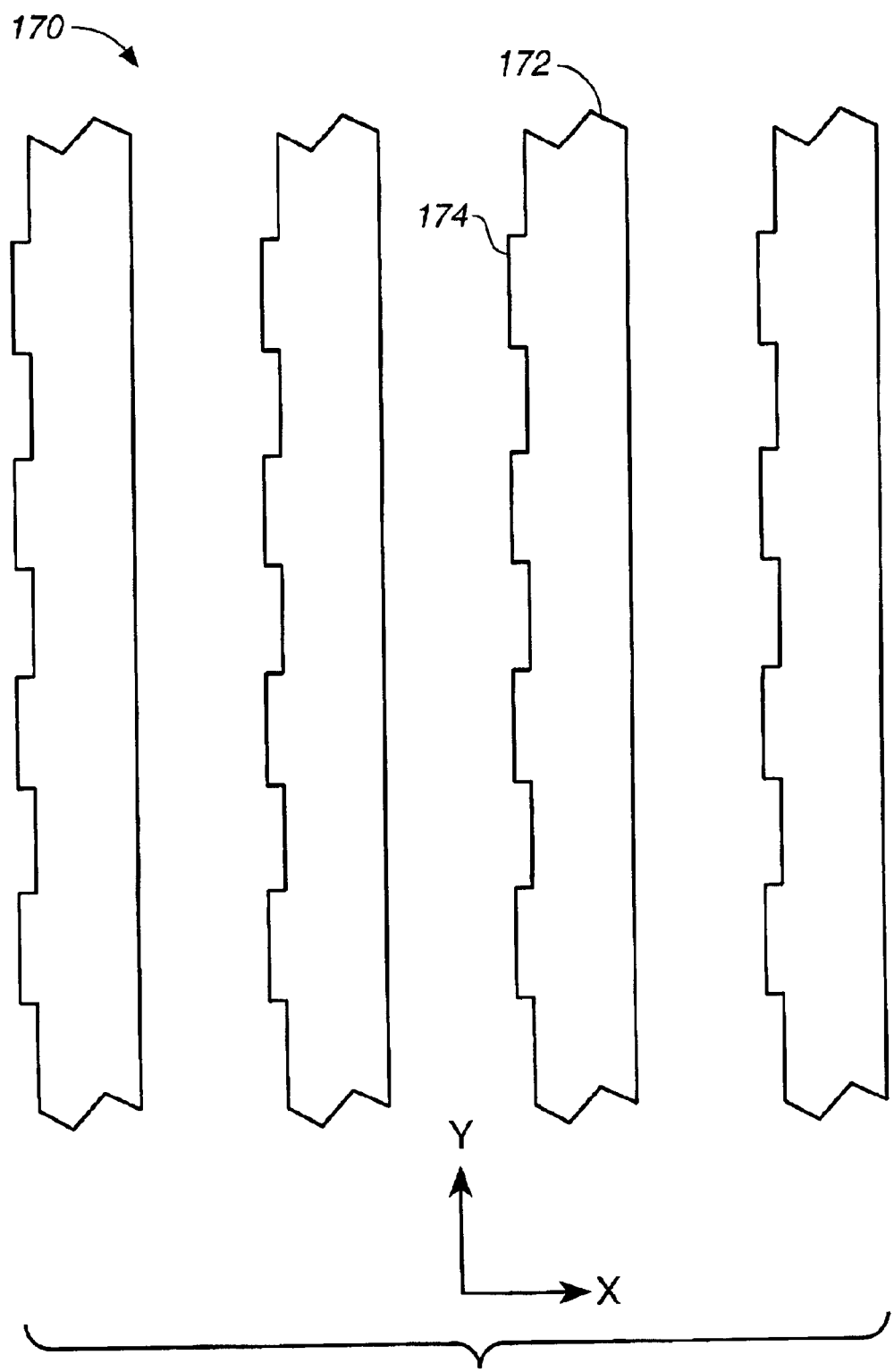
FIG._17

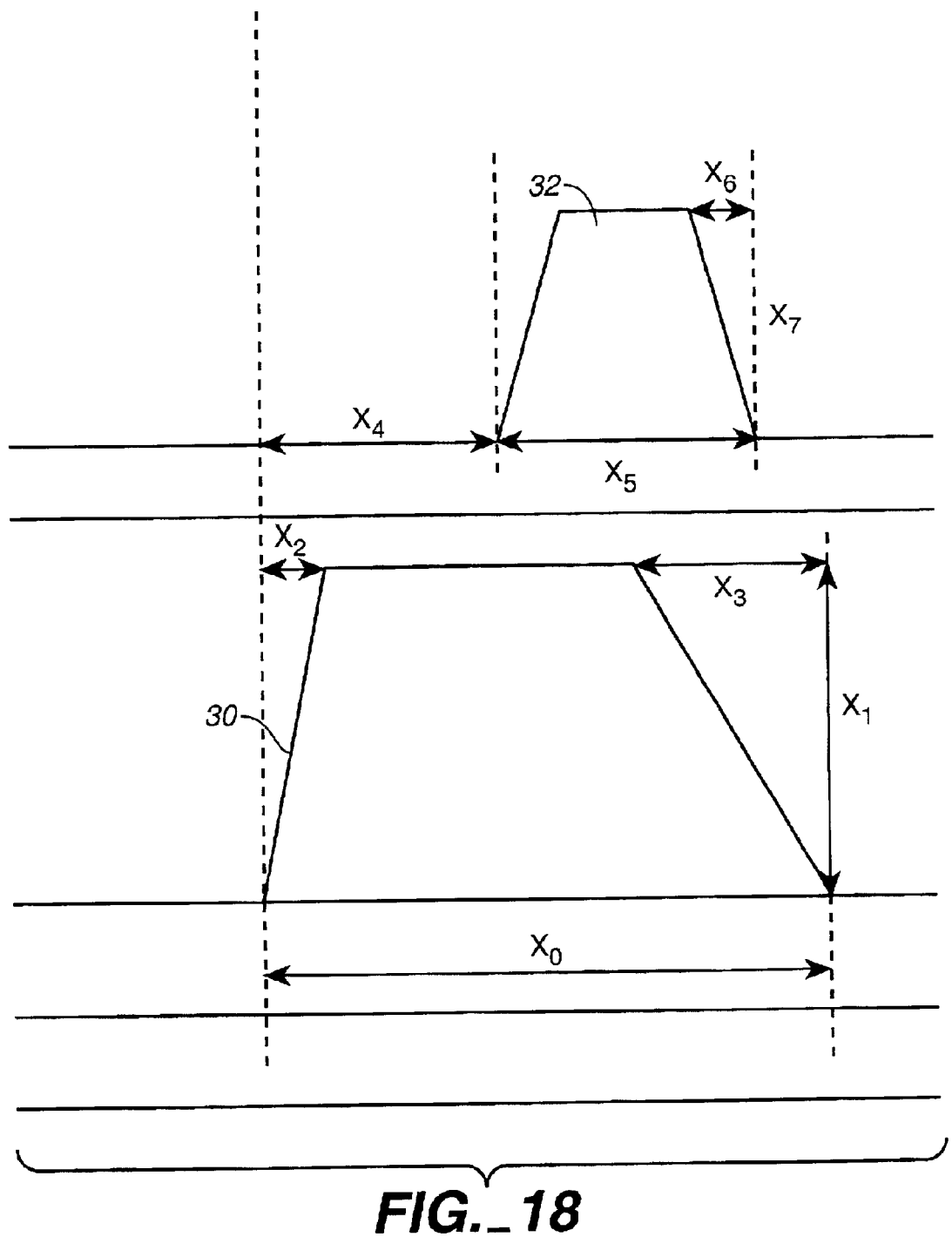
FIG._18

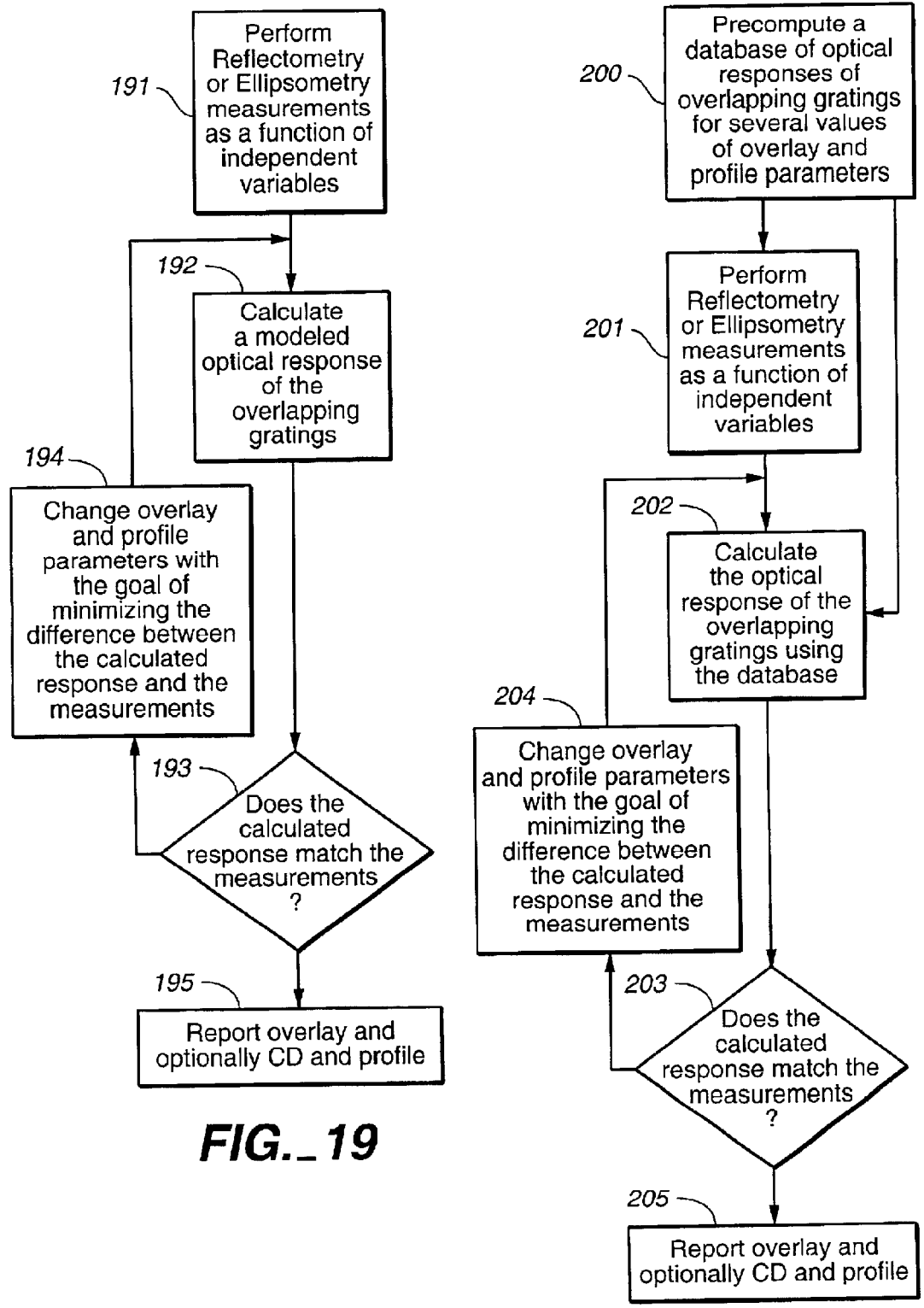
FIG._19
FIG._20

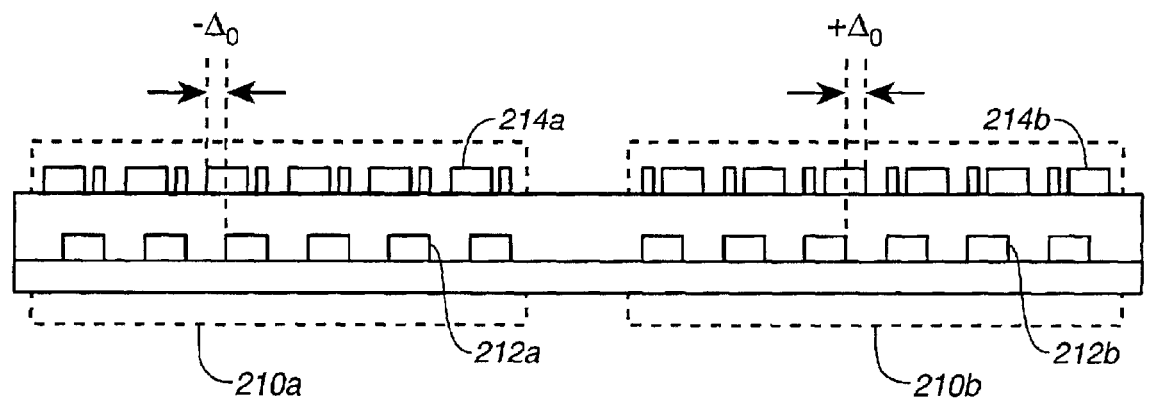
FIG._21
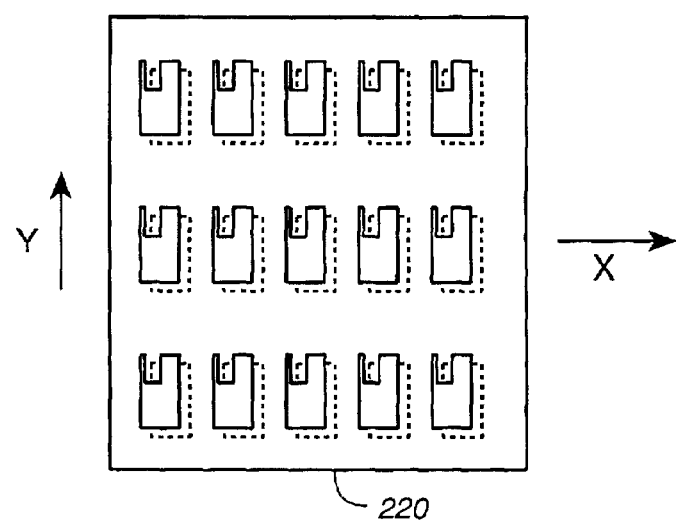
FIG._22

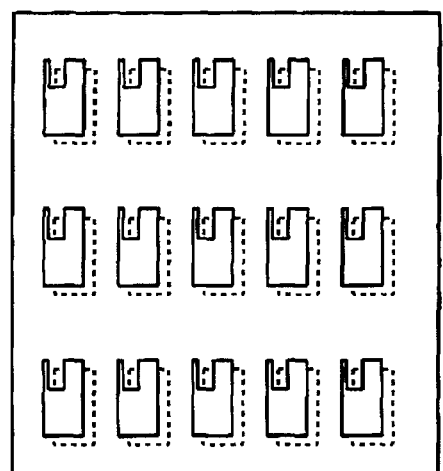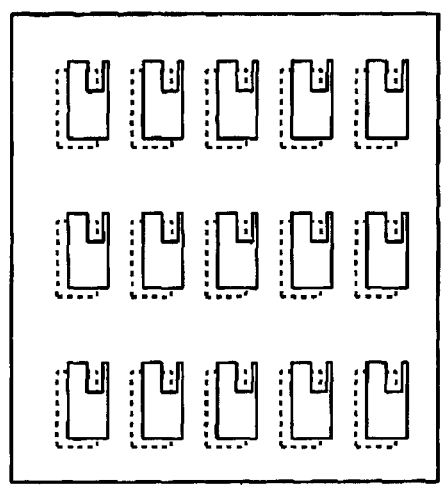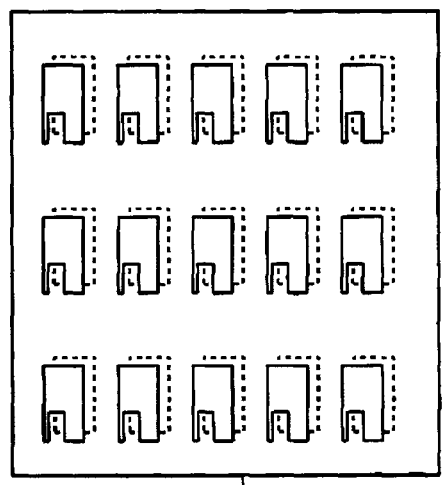
FIG._23

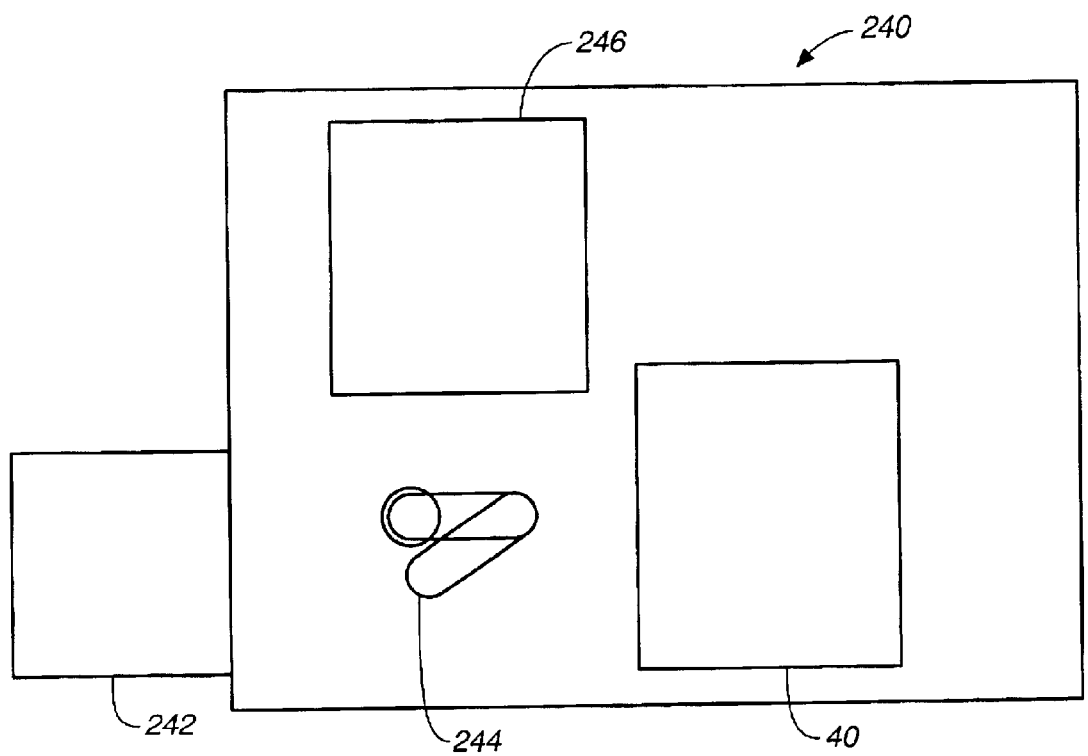
FIG._24
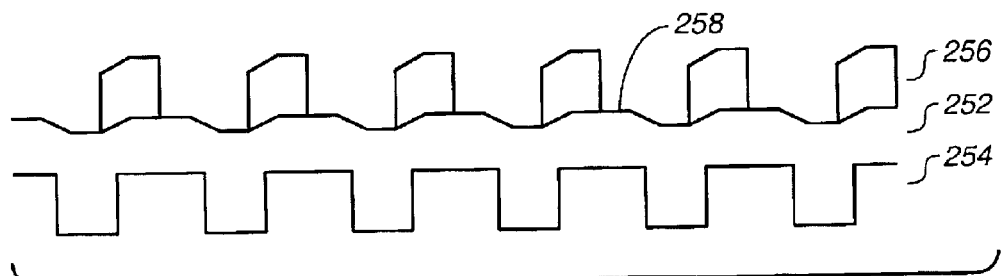
FIG._25

US 6,819,426 B2

OVERLAY ALIGNMENT METROLOGY USING DIFFRACTION GRATINGS

CROSS-REFERENCE TO RELATED APPLICATIONS

This patent application claims priority under 35 U.S.C. § 119(e) from prior U.S. provisional applications Nos. 60/268,485, filed Feb. 12, 2001, 60/295,111, filed Jun. 1, 2001, and 60/322,219, filed Sep. 14, 2001.

TECHNICAL FIELD

This invention relates to measuring the pattern overlay alignment accuracy of a pair of patterned layers on a semiconductor wafer, possibly separated by one or more layers, made by two or more lithography steps during the manufacture of semiconductor devices.

BACKGROUND ART

Manufacturing semiconductor devices involves depositing and patterning several layers overlaying each other. For example, gate interconnects and gates of a CMOS integrated circuit have layers with different patterns, which are produced by different lithography stages. The tolerance of alignment of the patterns at each of these layers can be smaller than the width of the gate. At the time of this writing, the smallest linewidth that can be mass produced is 130 nm. The state of the art mean +3σ alignment accuracy is 30 nm (Nikon KrF Step-and-Repeat Scanning System NSR-S205C, July 2000).

Overlay metrology is the art of checking the quality of alignment after lithography. Overlay error is defined as the offset between two patterned layers from their ideal relative position. Overlay error is a vector quantity with two components in the plane of the wafer. Perfect overlay and zero overlay error are used synonymously. Depending on the context, overlay error may signify one of the components or the magnitude of the vector.

Overlay metrology saves subsequent process steps that would be built on a faulty foundation in case of an alignment error. Overlay metrology provides the information that is necessary to correct the alignment of the stepper-scanner and thereby minimize overlay error on subsequent wafers. Moreover, overlay errors detected on a given wafer after exposing and developing the photoresist can be corrected by removing the photoresist and repeating the lithography step on a corrected stepper-scanner. If the measured error is minor, parameters for subsequent steps of the lithography process could be adjusted based on the overlay metrology to avoid excursions. If overlay error is measured subsequently, e.g., after the etch step that typically follows develop, it can be used to "scrap" severely mis-processed wafers, or to adjust process equipment for better performance on subsequent wafers.

Prior overlay metrology methods use built-in test patterns etched or otherwise formed into or on the various layers during the same plurality of lithography steps that form the patterns for circuit elements on the wafer. One typical pattern, called "box-in-box" consists of two concentric squares, formed on a lower and an upper layer, respectively. "Bar-in-bar" is a similar pattern with just the edges of the "boxes" demarcated, and broken into disjoint line segments, as shown in FIG. 1. The outer bars 2 are associated with one layer and the inner bars 4 with another. Typically one is the upper pattern and the other is the lower pattern, e.g., outer bars 2 on a lower layer, and inner bars 4 on the top. However, with advanced processes the topographies are complex and not truly planar so the designations "upper" and "lower" are ambiguous. Typically they correspond to earlier and later in the process. There are other patterns used for overlay metrology. The squares or bars are formed by lithographic and other processes used to make planar structures, e.g., chemical-mechanical planarization (CMP). Currently, the patterns for the boxes or bars are stored on lithography masks and projected onto the wafer. Other methods for putting the patterns on the wafer are possible, e.g., direct electron beam writing from computer memory, etc.

In one form of the prior art, a high performance microscope imaging system combined with image processing software estimates overlay error for the two layers. The image processing software uses the intensity of light at a multitude of pixels. Obtaining the overlay error accurately requires a high quality imaging system and means of focusing it. Some of this prior art is reviewed by the article "Semiconductor Pattern Overlay", by Neal T. Sullivan, Handbook of Critical Dimension Metrology and Process Control: Proceedings of Conference held 28–29 Sep. 1993, Monterey, Calif., Kevin M. Monahan, ed., SPIE Optical Engineering Press, vol. CR52, pp. 160–188. A. Starikov, D. J. Coleman, P. J. Larson, A. D. Lapata, W. A. Muth, in "Accuracy of Overlay Measurements: Tool and Mark Asymmetry Effects," Optical Engineering, vol. 31, 1992, p. 1298, teach measuring overlay at one orientation, rotating the wafer by 180°, measuring overlay again and attributing the difference to tool errors and overlay mark asymmetry.

One requirement for the optical system is very stable positioning of the optical system with respect to the sample. Relative vibration would blur the image and degrade the performance. This is a difficult requirement to meet for overlay metrology systems that are integrated into a process tool, like a lithography track. The tool causes potentially large accelerations (vibrations), e.g., due to high acceleration wafer handlers. The tight space requirements for integration preclude bulky isolation strategies.

The imaging-based overlay measurement precision can be two orders of magnitude smaller than the wavelength of the light used to image the target patterns of concentric boxes or bars. At such small length scales, the image does not have well determined edges because of diffraction. The determination of the edge, and therefore the overlay measurement, is affected by any factor that changes the diffraction pattern. Chemical-mechanical planarization (CMP) is a commonly used technique used to planarize the wafer surface at intermediate process steps before depositing more material. CMP can render the profile of the trenches or lines that make up the overlay measurement targets asymmetric. FIG. 2 illustrates an overlay target feature 2 which is a trench filled with metal. Surface 3 is planarized by CMP. The CMP process erodes the surface of the overlay mark 2 in an asymmetric manner. The overlay target 2 is compared subsequently to target feature 4 in the overlying layer, which could be, e.g., photoresist of the next lithography step. The asymmetry in target feature 2 changes the diffraction pattern, thus potentially causing an overlay measurement error.

In U.S. Pat. No. 4,757,207, Chappelow, et al. teach obtaining the quantitative value of the overlay offset from the reflectance of targets that consists of identical line gratings that are overlaid upon each other on a planar substrate. Each period of the target consists of four types of film stacks: lines of the lower grating overlapping with the spaces of the upper grating, spaces of the lower grating overlapping with the lines of the upper grating, lines of the lower and upper gratings overlapping, spaces of the lower and upper gratings overlapping. Chappelow et al, approximate the reflectance of the overlapping gratings as the average of the reflectances of the four film stacks weighted by their area-fractions. This approximation, which neglects diffraction, has some validity when the lines and spaces are larger than largest wavelength of the reflectometer. The reflectance of each of the four film stacks is measured at a so called macro-site close to the overlay target. Each macro-site has a uniform film stack over a region that is larger than the measurement spot of the reflectometer. A limitation of U.S. Pat. No. 4,757,207 is that spatial variations in the film thickness that are caused by CMP and resist loss during lithography will cause erroneous overlay measurements. Another limitation of U.S. Pat. No. 4,757,207 is that reflectance is measured at eight sites in one overlay metrology target, which increases the size of the target and decreases the throughput of the measurement. Another limitation of U.S. Pat. No. 4,757,207 is that the lines and spaces need to be large compared to the wavelength, but small compared to the measurement spot which limits the accuracy and precision of the measurement. Another limitation of U.S. Pat. No. 4,757,207 is that the light intensity is measured by a single photodiode. The dependence of the optical properties of the sample is not measured as a function of wavelength, or angle of incidence, or polarization, which limits the precision of the measurement.

The "average reflectivity" approximation for the interaction of light with gratings, as employed by U.S. Pat. No. 4,757,207, greatly simplifies the problem of light interaction with a grating but neglects much of the diffraction physics. The model used to interpret the data has "four distinct regions whose respective reflectivities are determined by the combination of layers formed by the substrate and the overlaid patterns and by the respective materials in the substrate and patterns." Eq. 1 in the patent clearly indicates that these regions do not interact, i.e., via diffraction, as the total reflectivity of the structure is a simple average of the four reflectivities with area weighting.

IBM Technical Disclosure Bulletin 90A 60854/GE8880210, March 1990, pp 170–174, teaches measuring offset between two patterned layers by overlapping gratings. There are four sets of overlapping gratings to measure the x-offset and another four sets of overlapping gratings to measure the y-offset. The four sets of gratings, which are measured by a spectroscopic reflectometer, have offset biases of 0, ¼, ½, ¾-pitch. The spectra are differenced as Sa=S0-S½, Sb=S¼-S¾; a weighted average of the difference spectra is evaluated: Ia=<w,Sa>, Ib=<w,Sb>, where w is a weighting function; and the ratio min(Ia, Ib)/max(Ia, Ib) is used to look up the offset/pitch ratio from a table. GE8880210 relies on "well known film thickness algorithms" to model the optical interactions. Such algorithms treat the electromagnetic boundary conditions at the interfaces between the planar layers or films. If the direction perpendicular to the films is the z direction, the boundaries between the films are at constant $z=z_n$, where $z_n$ is the location of the nth boundary. Such algorithms, and hence GE880210, do not use a model that accounts for the diffraction of light by the gratings or the multiple scattering of the light by the two gratings, and it has no provision to handle non-rectangular line profiles.

In U.S. Pat. No. 6,150,231, Muller et al. teach measuring overlay by Moire patterns. The Moire pattern is formed by overlapping gratings patterns, one grating on the lower level, another on the upper level. The two grating patterns have different pitches. The Moiré pattern approach requires imaging the overlapping gratings and estimating their offset from the spatial characteristics of the image.

In U.S. Pat. Nos. 6,023,338 and 6,079,256, Bareket teaches an alternative approach in which two complementary periodic grating structures are produced on the two subsequent layers that require alignment. The two periodic structures are arranged adjacent to and in fixed positions relative to one another, such that there is no overlap of the two structures. The two gratings are scanned, either optically or with a stylus, so as to detect the individual undulations of the gratings as a function of position. The overlay error is obtained from the spatial phase shift between the undulations of the two gratings.

Smith et al. in U.S. Pat. No. 4,200,395, and Ono in U.S. Pat. No. 4,332,473 teach aligning a wafer and a mask by using overlapping diffraction gratings and measuring higher order, i.e., non-specular, diffracted light. One diffraction grating is on the wafer and another one is on the mask. The overlapping gratings are illuminated by a normally incident light and the intensities of the positive and negative diffracted orders, e.g. $1^{st}$ and $-1^{st}$ orders, are compared. The difference between the intensities of the $1^{st}$ and $-1^{st}$ diffracted orders provides a feedback signal which can be used to align the wafer and the mask. These inventions are similar to the present one in that they use overlapping gratings on two layers. However, the U.S. Pat. Nos. 4,200,395 and 4,332,473 patents are applicable to mask alignment but not to overlay metrology. They do not teach how to obtain the quantitative value of the offset from the light intensity measurements. U.S. Pat. Nos. 4,200,395 and 4,332,473 are not applicable to a measurement system that only uses specular, i.e., zeroth-order diffracted light.

This invention is distinct from the prior art in that it teaches measuring overlay by scatterometry. Measurements of structural parameters of a diffracting structure from optical characterization are now well known in the art as scatterometry. With such methods, a measurement sample is illuminated with optical radiation, and the sample properties are determined by measuring characteristics of the scattered radiation (e.g., intensity, phase, polarization state, or angular distribution). A diffracting structure consists of one or more layers that may have lateral structure within the illuminated and detected area, resulting in diffraction of the reflected (or transmitted) radiation. If the lateral structure dimensions are smaller than the illuminating wavelengths, then diffracted orders other than the zeroth order may all be evanescent and not directly observable. But the structure geometry can nevertheless significantly affect the zeroth-order reflection, making it possible to make optical measurements of structural features much smaller than the illuminating wavelengths.

In one type of measurement process, a microstructure is illuminated and the intensity of reflected or diffracted radiation is detected as a function of the radiation is wavelength, the incidence direction, the collection direction, or polarization state (or a combination of such factors). Direction is typically specified as a polar angle and azimuth, where the reference for the polar angle is the normal to the wafer and the reference for the azimuth is either some pattern(s) on the wafer or other marker, e.g., a notch or a flat for silicon wafers. The measured intensity data is then passed to a data processing machine that uses some model of the scattering from possible structures on the wafer. For example, the model may employ Maxwell's equations to calculate the theoretical optical characteristics as a function of measurement parameters (e.g., film thickness, line width, etc.), and the parameters are adjusted until the measured and theoretical intensities agree within specified convergence criteria. The initial parameter estimates may be provided in terms of an initial "seed" model of the measured structure. Alternatively, the optical model may exist as pre-computed theoretical characteristics as a function of one or more discretized measurement parameters, i.e., a "library", that associates collections of parameters with theoretical optical characteristics. The "extracted" structural model has the structural parameters associated with the optical model which best fits the measured characteristics, e.g., in a least-squares sense.

Conrad (U.S. Pat. No. 5,963,329) is an example of the application of scatterometry to measure the line profile or topographical cross-sections. The direct application of Maxwell's equations to diffracting structures, in contrast to non-diffracting structures (e.g., unpatterned films), is much more complex and time-consuming, possibly resulting in either a considerable time delay between data acquisition and result reporting and/or the need to use a physical model of the profile which is very simple and possibly neglects significant features.

Scheiner et al. (U.S. Pat. No. 6,100,985) teaches a measurement method that is similar to that of Conrad, except that Scheiner's method uses a simplified, approximate optical model of the diffracting structure that does not involve direct numerical solution of Maxwell's equations. This avoids the complexity and calculation time of the direct numerical solution. However, the approximations inherent in the simplified model make it inadequate for grating structures that have period and linewidth dimensions comparable to or smaller than the illumination wavelengths.

In an alternative method taught by McNeil et al. (U.S. Pat. No. 5,867,276) the calculation time delay is substantially reduced by storing a multivariate statistical analysis model based on calibration data from a range of model structures. The calibration data may come from the application of Maxwell's equations to parameterized models of the structure. The statistical analysis, e.g., as taught in chemometrics, is applied to the measured diffraction characteristics and returns estimates of the parameters for the actual structure.

The measurement method taught by McNeil uses diffraction characteristics consisting of spectroscopic intensity data. A similar method can also be used with ellipsometric data, using ellipsometric parameters such as tan ψ, cos Δ in lieu of intensity data. For example, Xinhui Niu in "Specular Spectroscopic Scatterometry in DUV Lithography," Proc. SPIE, vol. 3677, pp. 159–168, 1999, uses a library approach. The library method can be used to simultaneously measure multiple model parameters (e.g. linewidth, edge slope, film thickness).

In International (PCT) application publication no. WO 99/45340 (KLA-Tencor), Xu et al. disclose a method for measuring the parameters of a diffracting structure on top of laterally homogeneous, non-diffracting films. The disclosed method first constructs a reference database based on a priori information about the refractive index and film thickness of underlying films, e.g., from spectroscopic ellipsometry or reflectometry. The "reference database" has "diffracted light fingerprints" or "signatures" (either diffraction intensities, or alternatively ellipsometric parameters) corresponding to various combinations of grating shape parameters. The grating shape parameters associated with the signature in the reference database that matches the measured signature of the structure are then reported as the grating shape parameters of the structure.

Definition of Terms

An unbounded periodic structure is one that is invariant under a nonzero translation in a direction when there exists a minimum positive invariant translation in the said direction. Here we are concerned with structures that are periodic in directions (substantially) parallel to the surface of a wafer. Here 'wafer' is used to mean any manufactured object that is built by building up patterned, overlying layers. Silicon wafers for microelectronics are a good example, and there are many others, e.g., flat panel displays.

A one-dimensional (1D) periodic structure has one direction in which it is invariant for any translation. The lattice dimension is perpendicular to the invariant direction. The smallest distance of translation along the lattice dimension which yields invariance is the pitch of the grating. Two-dimensional gratings are also possible, with two lattice directions and pitches, as is well known. In this application, a periodic structure is understood to be a portion of an unbounded periodic structure. The periodic structure is understood to extend by more than one period along its lattice axes. A grating is a periodic structure. A diffraction grating is a grating used in a manner to interact with waves, in particular light waves. A 1D grating is also referred to as a "line grating".

Upon reflection by or transmission through a diffraction grating, light propagates in discrete directions called Bragg orders. For a particular Bragg order m, the component of the wavevector along the lattice axis, $k_{x,m}$, differs from the same component of the wavevector of the incident wave by an integer multiple of the lattice wavenumber $2\pi/P$. For a line grating, $$k_{x,m} = \frac{2m\pi}{P} + \frac{2\pi \sin\theta_I}{\lambda} \quad m = 0, \pm 1, \pm, 2, \ldots$$

$$k_{z,m}^2 = \left(\frac{2n\pi}{\lambda}\right)^2 - k_{x,m}^2$$

where λ and $\theta_I$ are the wavelength and angle of the incident wave in vacuum (or something effectively like vacuum, e.g., air), n is the refractive index of the transparent medium that separates the two gratings. P is the pitch of the grating. The x-axis is the lattice axis and the z-axis is perpendicular to the plane of the wafer. The Bragg orders are referenced by the integer m. The Bragg orders for which $k_z^2 < 0$ are called evanescent, non-propagating, or cut-off. The evanescent Bragg orders have pure imaginary wavenumbers in the z direction. Hence, they exponentially decay as $\exp(-|Im(k_z)||z|)$ as a function of the distance z, measured from the diffraction grating along the z-axis.

The polar angle θ and azimuth φ are defined as shown in FIG. 3, with respect to the lateral or in-plane directions x and y, and the vertical or out of plane direction z. The figure applies generally to objects that are substantially planar, or locally to curved objects. The orientation of the lateral directions x and y may correspond to physical features on the wafer, e.g. structures 5 deposited or formed on the wafer (substrate), or actually part of the substrate, e.g., a wafer notch.

The spot of an optical instrument is the region on a sample whose optical characteristics are detected by the instrument. The measurement system can translate the location of the spot on the sample, and focus it, as is well known in the art.

DISCLOSURE OF INVENTION

The present invention measures the overlay error of layers on a wafer with low-resolution optics. The basic overlay metrology target used in the present invention comprises a pair of overlapping diffraction gratings, i.e., a lower grating on a lower (or earlier formed) layer and an upper (or later formed) grating. The spot of the optical instrument preferably covers many periods of the gratings and it does not necessarily resolve the lines of the grating. The overlay error is measured by scatterometry, the measurement of optical characteristics, such as reflectance or ellipsometric parameters, as functions of one or more independent variables, e.g., wavelength, polar or azimuthal angles of incidence or collection, polarization, or some combination thereof.

It is an object of the present invention to use scatterometry to accurately measure overlay error. It is also an object of the invention that this accurate overlay measurement be obtained even when the profile of the grating lines has been altered or rendered asymmetric by a process such as chemical-mechanical planarization. An instrument meeting these objectives has utility in standard planar/photolithographic technology used for microelectronics manufacture, as well as other technologies using multiple patterned layers. This has the advantage that the same measurement hardware used for other optical measurements, e.g., line profiles or film thicknesses, can be used for another critical measurement, that of overlay.

The method includes the steps of laying down a first grating during a first step of manufacturing (making) a planar structure, laying down a second grating during a second manufacturing step so that the second grating substantially overlaps the first grating (laterally, in x and y), then illuminating at least a portion of the region of overlap, detecting radiation that has interacted with both gratings, and inverting for the offset between the gratings as a parameter of a model. The critical dimension (CD) and line profile also may be measured, simultaneously or with additional, similar measuring and data processing steps.

It is another object of the present invention to describe an apparatus for practicing the above method. The apparatus comprises an instrument receiving a sample and including a source of illumination and a detector that detects light which has interacted with the sample. The sample comprises a first grating fabricated at one stage of making a planar structure and characterized by a first pitch, a second grating with a second, possibly substantially identical, pitch that is formed during a second stage such that the second grating substantially overlaps the first grating in the lateral dimensions. The pitches of the gratings and the parameters of the instrument are chosen such that some energy in one or more non-zero orders diffracted by one of the gratings propagates in the sample media between the two gratings and reaches the other grating. The instrument is suitable for also measuring CD and line profile, as well as the overlay measurement mentioned above.

It is understood that 'optical' means employing one or more wavelengths of electromagnetic radiation in the UV, visible, or infrared portions of the spectrum. It is also understood that each Bragg order has a range of propagation angle and a range of wavelength, given the nature of the instrument, e.g., numerical aperture (NA) and detector or source wavelength resolution.

It is another object of the present invention to measure overlay error with an optical instrument integrated into a process tool. This method and apparatus overcomes the difficulties associated with vibrations caused by the process tool and the limited space available for vibration damping. The apparatus comprises a process tool with at least one process chamber and a sample handler, an optical system in operative communication with the process tool, a computer equipped with an inverse model for interaction of light between two gratings where at least one parameter of the model is a lateral offset between two gratings.

It is another object of the present invention to measure the overlay error by comparing the optical characteristics of grating pairs with substantially different perfect-overlay offsets. This reduces the dependence of the measurements on ancillary properties of the sample. It also reduces the burden on inverse scattering calculations.

It is another aspect of the present invention to increase the range of unambiguous overlay error measurement from overlaying gratings. One approach is to offset symmetric gratings by one fourth of the grating pitch when the overlay error is zero, so that positive and negative overlay errors have the least ambiguity, regardless of the optical system. Another approach to extend the range of unambiguously detectable overlay errors is to make at least one of the gratings in the pair substantially asymmetric, that is to have the unit cell of its pattern asymmetric. Another approach is to combine a scatterometry measurement of offset with an imaging measurement of offset (similar to the prior art, e.g., using box-in-box). A fourth approach is to have grating pairs with different pitches, preferably in a substantially irrational ratio, to measure the same component of overlay error. These four approaches may be used either separately or in combination to extend the range of unambiguously detectable overlay errors.

BRIEF DESCRIPTION OF THE DRAWINGS

FIG. 1 is a top plan view of a box-in-box pattern used for overlay metrology of the prior art.

FIG. 2 is a side sectional view of a wafer portion having the prior art overlay metrology pattern of FIG. 1, illustrating a test pattern that has been rendered asymmetric by a planarization (CMP) process.

FIG. 3 is a perspective diagram illustrating the definition of angle of incidence $\theta_I$ and azimuth angle $\phi$ as used herein.

FIG. 4 is a diagram of the measurement instrument in relation to the test patterns.

FIG. 5 is a top view of a simple first embodiment of test patterns according to the present invention, the patterns being in the form of two sets of overlapping gratings placed in an inactive area on a wafer for measuring respective x and y components of the overlay.

FIG. 6 is a cross sectional view of one of the test patterns in FIG. 5, showing the overlapping diffraction gratings.

FIG. 7 is a cross sectional view like FIG. 6 except that the profile of the line features of the lower grating have been rendered asymmetric by a planarization (CMP) process.

FIGS. 8a-8c are side schematic views showing how a grating pair with symmetric gratings gives unambiguous overlay error indications over a range of one half the grating's period.

FIG. 8d is a graph of coverage function versus indicator offset Δ for the grating pairs in FIGS. 8a-8c.

FIG. 9 is a side schematic view of a portion of the grating pair of FIG. 6 illustrating the configuration and dimensions used in the numerical study in FIGS. 10a-10d and 11.

FIGS. 10a to 10d are graphs of reflectance versus wavelength when the registration error in the configuration of FIG. 9 is respectively +8 nm, ±32 nm, ±64 nm, and ±128 nm, where the grating period in each case is 512 nm. Reflectance versus wavelength for zero offset is used as a comparative reference curve in each of the graphs.

FIG. 11 is a graph of reflectance change per offset change (dR/dΔ) versus wavelength, i.e. spectral sensitivity to overlay error, for different grating pitches (256 nm, 512 nm and 1024 nm).

FIG. 12 is a side cross sectional view of a test pattern of overlapping diffraction gratings, as in FIGS. 6 and 9, except that the gratings have an asymmetric line width and spacing configuration. Preferred nominal dimensions for the calculation used to produce the graphs in FIGS. 14 and 15a-15k are also indicated.

FIGS. 13a and 13b are side cross sectional views of test patterns as in FIG. 12, but with respective right and left overlay offsets, illustrating the ability to distinguish and measure small, opposite overlay errors.

FIG. 14 is a graph of reflectance versus wavelength at normal incidence for the test pattern of FIG. 12 with perfect overlay alignment.

FIGS. 15a to 15k are graphs of the difference in spectral reflectance relative to the values in FIG. 14 for overlay errors of ±1 nm, ±2 nm, ±5 nm, ±10 nm, ±20 nm, ±50 nm, ±100 nm, ±200 nm, ±300 nm, ±400 nm, and ±500 nm, respectively.

FIG. 16 is a graph of linear estimate of overlay as a function of the actual overlay.

FIG. 17 is a plan view of a quasi-one-dimensional, asymmetric grating.

FIG. 18 is a schematic side view showing parameters for grating lines with asymmetric profile.

FIGS. 19 and 20 are flow diagrams for two methods in accord with the present invention for using the parameters in FIG. 18 to calculate the overlay error.

FIG. 21 is a schematic side view of an alternative test pattern for differential measurement of alignment offset which is insensitive to geometrical and material properties of the gratings.

FIG. 22 is a top view of an alternative embodiment that uses a three-dimensional grating.

FIG. 23 shows mirrored images of the three-dimensional grating of FIG. 22 which can be used with that grating to reduce sensitivity to geometrical and material properties of the gratings.

FIG. 24 shows a top schematic view of a process tool with a metrology system suitable for practicing the current invention.

FIG. 25 is a cross sectional view of one of a test patterns where, although the material between the two gratings is lossy, there is sufficient physical indication of the lower grating to affect the optical characteristics and allow the measurement of overlay.

BEST MODE OF CARRYING OUT THE INVENTION

Referring to FIG. 5, in the simplest embodiment of the present invention, two test patterns 10 and 20, each having a pair of overlapping gratings, are placed in a region on the wafer that does not interfere with the devices that are being manufactured. For example, the test patterns can be placed on a scribe line 7 between the dies on a wafer. Test pattern 20 is similar to test pattern 10 rotated by 90 degrees. Each of the test patterns 10 and 20 consists of two overlying gratings 30 and 32 diagrammatically shown in cross section in FIG. 6 or 7. FIG. 7 differs from FIG. 6 only in that the line features in lower grating 30 have an asymmetric profile, e.g. due to a chemical-mechanical planarization (CMP) process. Grating 30 is formed on the lower layer, i.e., at an earlier stage of fabrication. Grating 32 is subsequently formed on the upper layer, which needs to be well aligned laterally with the lower layer. There may be one or more layers 31 between gratings 30 and 32. The upper and lower layers may overlap in the vertical direction z due to a lack of planarity in the layer manufacture. The layers 31 are transparent or partially transparent to light, at least in part of the wavelength spectrum detected by the optical instrument.

Referring to FIG. 4, the test patterns 10 and 20 are measured by an optical instrument 40, preferably sequentially. The optical instrument 40 can be virtually any optical instrument that illuminates the sample and records at least one property of light that has interacted with the sample. The instrument preferably operates in reflection mode. Embodiments include reflectometers and ellipsometers, which are well known in the art. A reflectometer measures some function of the intensity of light reflected from the sample. In a preferred embodiment, the optical instrument measures spectral reflectance R. Stanke et al. give a complete description of such an optical instrument in U.S. patent application Ser. No. 09/533,613, Apparatus for Imaging Metrology, which is incorporated herein by reference.

There are many other instruments described in the literature suitable for alternative embodiments. An ellipsometer measures some function of the complex ratio $r_P/r_S$ of the complex reflection coefficients for the P and S polarizations. Piwonka-Corle et al. describe in detail a suitable ellipsometer for practicing the current method in U.S. Pat. No. 5,608,526, Focused Beam Spectroscopic Ellipsometry Method and System, which is incorporated herein by reference. Other ellipsometers could also be used. The optical electric field is parallel and perpendicular to the plane of incidence for the P and S polarizations, respectively. Typically ellipsometers report the ellipsometric parameters $\Psi$ and $\Delta$ wherein $r_P/r_S = \tan(\Psi)e^{i\Delta}$. Other parameterizations of the results from ellipsometry are possible. For example the rotational Fourier coefficients of intensity measured by a rotating-compensator ellipsometer, as discussed in "Broadband spectral operation of a rotating-compensator ellipsometer", by Opsal et al., Thin Solid Films, 313–314 (1998), 58–61. Other instruments rely on multiple angle of incidence measurements either alone or in combination with measurements of multiple wavelengths. Certain embodiments permit simultaneous measurements at multiple angles of incidence without any moving parts. Examples of such instruments can be found in U.S. Pat. No. 5,889,593 and in pending U.S. patent application Ser. No. 09/818,703, filed Mar. 27, 2001.

In all embodiments, measurements are made as functions of one or more independent optical variables. Independent optical variables can include the wavelength $\lambda$, polar angles $\theta$, azimuthal angles $\phi$ and polarization states, for incident and scattered light. Different embodiments may include any combination of the properties of incident and detected light, similar to those discussed above, at any combination and range of the independent optical variables $\lambda$, $\theta$, $\phi$. The preferred embodiment for integration in process tools uses wavelength $\lambda$ as the independent variable.

Various transformations of the above mentioned independent variables may serve as an independent variable. In a simple case, wavenumber may be used instead of wavelength. In another case, each "wavelength" may actually consist of a combination of many wavelengths, e.g., due to the finite resolution of the instrument. Other more complex transformations are also possible.

The preferred optical instrument contains a broadband light source 42 and a spectroscopic detector 44. The wavelength spectrum of light source 42 and the spectral sensitivity of detector 44 overlap substantially. The spot 46 of optical instrument 40 is preferably completely contained in the gratings 10 and 20, one at a time. Alternatively, the spot may be sensitive to a region on the wafer that contains other zones, e.g., a zone surrounding an overlay pattern, and the data interpreted accordingly, e.g., with the method described in U.S. patent application Ser. No. 09/735,286 or in U.S. Pat. No. 6,100,985. The size of spot 46 is preferably many times the grating period. The measurement is substantially insensitive to lateral shift or vibration of the sample, especially when spot 46 is contained in one of the test patterns. In a preferred embodiment, the diameter of the spot is typically 40 $\mu$m, gratings 10 and 20 are 80 $\mu$m by 80 $\mu$m each, the pitches of all the gratings are 0.5–1.0 $\mu$m (with 1.0 $\mu$m being preferred), and the wavelength interval is 250 nm to 800 nm. The preferred angles of incidence and detection are substantially at $\theta$=0, with the illumination NA equal to 0.14 and detection NA equal to 0.07. For such a "normal incidence" instrument, the angle $\phi$ is preferably indeterminate. The invention is not limited to these particular optical parameters.

The optical measurement does not rely on imaging or scanning the patterns 10 and 20. The detector 44 need not have pixels that correspond to different positions on the wafer. The measurement is ideally independent of the position of spot 46, especially when the spot is completely contained within grating area 10 or 20. Even if the spot is not contained within the grating area, the sensitivity to precise placement of the spot with respect to the grating is weak and does not preclude a useful measurement of overlay.

Because the diffraction grating 30 is contained in the lower or earlier formed layer and the diffraction grating 32 is contained in the upper or later formed layer, the position of grating 32 relative to grating 30 depends on the alignment offset of the two layers. The way the Bragg orders interfere depends on the amount of the lateral offset between the two gratings. Hence, the observed reflectance from the test pattern 10 depends on independent variables (e.g., wavelength) and the overlay error of the two layers along the x-axis. Overlay error can be deduced from the characterization of reflected light as a function of independent variable (s), as described below. Similarly, the reflectance from grating pattern 20 depends on the overlay error of the two layers along the y-axis. In the preferred embodiment, the detector 44 performs a measurement on the 0-th Bragg order, i.e., $\theta_I$=$\theta_D$, although the invention is not specifically limited to detecting the 0-th order.

The measurement depends on optical interaction of the two gratings. The gratings interact through Bragg orders. Some Bragg orders are propagating, and some are evanescent or non-propagating. Depending on the degree of evanescence and the distance between the two gratings, evanescent orders may contribute to this interaction. However, in the preferred embodiment, at least two orders are propagating in region 31 between the two gratings. Generally, the zeroth order will be propagating. This will always be the case if the refractive index (indices) of the material(s) between gratings 30 and 32 are greater than or equal to the refractive index of the medium that contains the device under test, or wafer. In order for a (positive or negative) first order to be propagating in the region between the two gratings:

$$\left(\frac{2\pi m}{P}+\frac{2\pi}{\lambda}\sin\theta_I\right)^2<\left(\frac{2\pi n}{\lambda}\right)^2 \text{ for } m=+1 \text{ or } m=-1$$

in cases where the imaginary part of the refractive index n is zero or negligible. For normal incidence, we have:

$$P>\frac{\lambda}{n}$$

In the equations above, n is the refractive index of layers 31 between the two gratings 30 and 32. If there are several layers 31, n is the refractive index of the least refractive layer. If the largest wavelength in the spectroscopic measurement is 790 nm, the transparent medium between the two gratings is $SiO_2$, and the measurement instrument operates at normal incidence ($\theta_I$=$\theta_D$≅0), then the pitch is preferably no less than 541 nm. Otherwise, at least some of the spectrum will be insensitive to the overlay.

When the layers between the gratings are lossy, and the refractive index n has an imaginary part, all the orders are attenuated to some extent as they propagate through the lossy medium. However, in practice, a first order will give the desired interaction as long as the attenuation ratio through all intervening layers of thickness t $$\exp\left\{-\left|\mathfrak{I}\sqrt{\left(\frac{2\pi n}{\lambda}\right)^2-\left(\pm\frac{2\pi}{P}+\frac{2\pi}{\lambda}\sin\theta_I\right)^2}\right|t\right\}$$

is small compared to 1. $\mathfrak{I}(u)$ denotes imaginary part of the complex variable u.

In order to describe parts of the invention, it is useful to introduce an indicator offset and a coverage function of the indicator offset which is not an essential part of the invention. The following discussion concentrates on finding one component of overlay, x for example. The same would apply to the second component in the direction y. FIG. 8a shows one period P of a grating pair comprising lower grating 81 and upper grating 83 with zero offset $\Delta_0$=0 between the left edge of line 85 in lower grating 81 and the left edge of line 87 in upper grating 83. Left and right are used to distinguish the negative and positive directions along the axis under discussion. For this example, the upper and lower gratings have the same pitch and the same linewidth. FIGS. 8b and 8c show different values of the indicator offset $\Delta_1$ and $\Delta_2$ In FIG. 8c it is apparent that the upper grating is periodic, as the portion of upper line 87a has entered period P from the left and some of portion 87b has exited P, due to indicator offset $\Delta_2$. The lower grating is also periodic, although it is not apparent in the figure.

FIG. 8d shows the coverage function for this grating pair, the relative proportion of lower line 85 covered by upper line 87. A value of unity for the indicator function indicates that the upper line covers all of the lower line.

For this particular grating pair, an optical system that has substantial left/right symmetry, cannot distinguish offsets $\Delta$ and −$\Delta$. This will be true for many optical systems, e.g., one operating at normal incidence, and others as well. This will also be true for many grating pairs, especially when the individual gratings have left/right symmetry. In these cases the system can at best uniquely resolve offsets over a range of half a period, i.e., −0<$\Delta$<P/2. In order to allow similar ranges of negative and positive overlay error, the grating pair is preferably designed so that $\Delta$=±P/4 for perfect overlay. Referring to FIG. 6, in order to distinguish overlay in the +x and −x directions, the gratings 30 and 32 are preferably offset with respect to each other when the two layers have perfect (zero) overlay. In the preferred implementation, gratings 30 and 32 are offset by a quarter period at perfect overlay.

FIGS. 10a to 10d show examples of theoretically calculated reflectances for various overlays of the gratings in FIG.

6 that demonstrate the ability to distinguish positive and negative overlay. FIG. 11 shows that a smaller pitch gives greater sensitivity to overlay as long as the first Bragg order is propagating. FIG. 9 shows the configuration and the dimensions of the gratings used in the numerical example shown in FIGS. 10a-10d and 11. The two gratings are designated to be offset from each other by a quarter period when the two layers are perfectly registered.

It is advantageous to use a grating pair with at least one asymmetric grating. As discussed above, symmetric gratings with an optical system that does not distinguish left and right gives a maximum range of unambiguous offsets of plus and minus one quarter of the pitch. For many optical systems, including the preferred embodiment, the gratings' optical characteristics may be the only 'reference' to distinguish left from right. FIG. 12 shows a preferred embodiment of a grating pair with two asymmetric gratings. Here the asymmetry refers to the different widths and spacing of the grating lines, rather than an asymmetry in the profile of the individual lines of a grating. Both lower grating 120 and upper grating 122 have the same pitch P. The pitch P may be nominally 1 micron. Both gratings have narrow lines 123, narrow spaces 124, wide lines 125 and wide spaces 126 in one unit cell, i.e., one pitch P. The narrow lines and spaces may be all nominally 160 nm wide. The wide lines and spaces may be all nominally 340 nm wide. Lower grating 120 has polysilicon lines separated by oxide spaces and may be nominally 93 nm thick (or high). Upper grating 122 may have nominally 380 nm high photoresist lines with air spaces. Lower grating 120 rests on gate oxide 115 which in turn lies upon silicon substrate 110. Interlayer dielectric 121 is typically a silicon dioxide preparation such as TEOS or BPSG. Other dimensions and materials could be used.

While the preferred embodiment refers explicitly to polysilicon structures in the lower grating, as are currently used for gates) many other structures are possible, e.g., for isolation trenches or metal lines embedded in interlayer dielectric, as is well known in the art. Also, the upper grating in the preferred embodiment contains photoresist, but alternative embodiments may have alternative structures, like etched structures.

FIG. 13a shows grating pair 130 with small offset $\Delta_0$ of the upper grating to the right with respect to the lower grating. FIG. 13b shows grating pair 135 with its upper grating having a shift $\Delta_1$ to the left with respect to the lower. These are shifted versions of the grating pair in FIG. 12, which shows the preferred shift (between upper and lower gratings) for perfect overlay. The upper and lower gratings in that figure are aligned, which would render small positive and negative overlay errors ambiguous if the gratings were symmetric, as discussed above, for an optical system without left/right sensitivity. However, close examination of FIGS. 13a and 13b, and simple heuristic arguments show that ambiguity is not necessarily the case for this preferred embodiment. For example, the left edge of lower narrow line 132 lies directly below upper wide space 133. This is a distinctly different configuration than in FIG. 13b were the right edge of lower wide line 137 is directly below upper wide space 138. Therefore, the optical response characteristics for small left and right shifts are distinguishable, and indeed for any shifts modulo one period. The preferred embodiment with two asymmetric gratings has them perfectly aligned ("in phase", spatially) for perfect overlay. Alternative embodiments have other alignments between the upper and lower gratings for perfect overlay.

FIG. 14 shows the calculated spectral reflectance at normal incidence for the structure in FIG. 12 at perfect overlay alignment. The calculations in this example are based on the nominal preferred dimensions shown in FIG. 12. FIGS. 15a through 15k show the change in the calculated spectral reflectance from that of perfect overlay in FIG. 14 for overlay errors of ±1 nm, ±2 nm, ±5 nm, ±10 nm, ±20 nm, ±50 nm, ±100 nm, ±200 nm, ±300 nm, ±400 nm, and ±500 nm, respectively. The graphs show the ability to distinguish positive and negative overlay error up to, but not including, overlay errors of one-half of the grating pitch. FIG. 15k shows that for a pitch of 1000 nm, the results of +500 nm and −500 nm overlay are indistinguishable. FIG. 16 shows the linear estimate of overlay as a function of actual overlay. The simple linear estimate is shown as markers on the plot. The estimate for overlay at each value of actual overlay is based on the differences in spectral reflectance shown in FIGS. 14 and 15. The dashed curve in FIG. 16 shows the ideal response: there would be a 1:1 correspondence between the linear estimator and the actual overlay in the ideal case. One such linear estimator is described in detail below with reference to FIG. 21.

The preferred method of introducing asymmetry into the gratings is to use multiple lines and spaces in the gratings per period as discussed above. The advantage is that the desired asymmetry is likely to stay intact regardless of process parameters. However, there are and will be many other methods to introduce asymmetry into the gratings used for overlay measurement. This is especially true for advanced and future processes. For example, some micro-machining techniques use gross undercut, and the asymmetry can be introduced in the undercut. Alternatively, effective asymmetry can be introduced by intentional "imperfections". For example, in FIG. 17, grating 170 is made of features 172 that are nominally lines, but they have asymmetric features 174 that break the reflection symmetry in lattice dimension x. The optical model for the structure 172 might approximate it as a one-dimensional grating, with some "perturbation" on one edge. Offsetting individual lines by different amounts in y could improve the validity of such an approximation. The averaging of the optical system along the invariant direction would support such approximation. Alternatively, asymmetry may be introduced not in the patterns for the structures, but by known process characteristics. For example, CMP currently is known to introduce asymmetry in gratings. Controlling (or knowing) this asymmetry locally can give the desired asymmetry to the overlay metrology structure, to resolve the ambiguities associated with offset by half a period.

Referring again to FIG. 4, a camera 48 and image recognition software may be used to position spot 46 so that it is contained in diffraction grating 10 and 20, one at a time. (Note that the schematic drawing is not to the preferred scale, e.g., the spot preferably senses many periods of the gratings.) Either the optics of instrument 40, the stage that holds the wafer or both are movable. A computer code assesses the relative position of the wafer and optics based on the image from camera 48 and translates the wafer and/or the optics until the desired alignment is achieved. The tolerance of this alignment is large, on the order of 1 to 10 micrometers, i.e. greater than the desired overlay precision. The tolerance need not be comparable to the desired accuracy or repeatability of the overlay measurement. Camera 48 is used only to find the measurement site. It does not contribute to the data that is used to measure the overlay error with high precision. However, camera 48 can be used to measure gross overlay errors that exceed plus or minus half the period of the diffraction gratings 120 and 122 (FIG. 12). The offset measured using the test patterns 10 and 20 is uncertain up to an integer multiple of grating periods, if the upper and lower gratings 120 and 122 are substantially asymmetric. For symmetric gratings, e.g., 30 and 32 in FIG. 6, the offset is uncertain up to an integer multiple of half grating periods. Any low-resolution overlay error measurement could be used to resolve this ambiguity. This uncertainty is preferably removed by using camera 48 and a conventional box-in-box or bar-in-bar pattern in addition to test patterns 10 and 20.

Alternatively, x-uncertainty in the overlay measurement along the x-axis can be reduced by providing two test structures 10a and 10b, each similar to test structure 10, but having different grating periods. The ratio of the periods is preferably an irrational number, for example √3. The same approach can be used in the y direction, e.g., with two test structures 20a and 20b in place of structure 20 to measure the offset along the y-axis.

Referring again to FIGS. 6 and 7, in addition to the overlay error and the wavelength, the diffraction characteristics and optical response of the test structures depend on the geometric and material properties of gratings 30 and 32, intermediate layers 31, and substrate or underlying layers 29. Overlay metrology requires the knowledge of these parameters. Material properties are preferably obtained by performing ellipsometric measurements on films of these materials deposited on well characterized substrates such as silicon wafers as a separate step to actually measuring overlay error.

The geometric parameters of the gratings and the films are preferably obtained from the spectroscopic data by regression, e.g., fitting a model to the data by nonlinear least squares. Referring, for example, to FIG. 6, the model for interaction of light with the two gratings preferably allows explicitly for the volume nature of the grating, and for boundaries between materials of differing properties in at least two dimensions. Thus the model allows explicitly for variations in at least two dimensions. The preferred model is rigorous coupled wave analysis, similar to the models employed in U.S. Pat. Nos. 5,963,329 and 5,867,276. Alternative models for electromagnetic scattering from a volume include, e.g., the finite element method, the boundary integral method, Green's function formulations of scattering from volumes, etc. Such models account for diffraction from all boundaries in the grating volume. When treated with rigorous coupled wave analysis, multiple interactions between the two gratings, via their respective diffracted orders, are explicitly modeled. While a method like the finite element model does not use the same formulation, it can accurately account for the same effects. Well known thin-film models, which are essentially one dimensional in nature, cannot fully account for the diffraction that takes place.

FIG. 18 shows a parameterization for the preferred model of overlay and line profiles of two diffraction gratings 30 and 32. Parameters $x_0, x_1, \ldots, x_7$ describe the two grating lines and their offset ($x_4$). In this way, calculating the optical response of the overlapping gratings on a sample can take into account the profiles of the grating structures, including asymmetries caused by manufacturing processes. One embodiment of a nonlinear least squares fit operation, as shown in FIG. 19, determines (i.e., estimates) these unknown parameters. In this example, the asymmetry of grating line 32 is accounted by the two independent parameters $x_2$ and $X_3$. In FIG. 19, reflectometry or ellipsometry measurements as a function of one or more independent variables (wavelength λ, incidence or collection angle θ, incidence or collection azimuth φ, etc.) are performed 191.

An optical response for a specified set of overlay and profile parameters is calculated 192 and compared 193 with the measurements. The parameters are continually changed 194 in order to minimize the difference between the calculated response and the measurements. Once a best match is found 193, the overlay (and optionally, the CD and profile) is reported 195.

Many estimation methods and variations are suitable. E.g., theoretical spectral models corresponding to various alignment offsets and grating parameters can be pre-computed and saved in a library. The alignment offset as well as grating parameters can be obtained by finding the model in the library that matches the measured spectrum most closely. This approach uses a single grating pair 30 and 32 to determine a single component of offset error. It is preferred, e.g., over the method using a pair of grating pairs, described below, to keep the 'real estate' on the wafer required for test patterns to a minimum. A flow diagram of one such algorithm is shown in FIG. 20. A database or library of optical responses is pre-computed 200 for overlapping grating structures with several values of overlay and profile parameters. Then, as before, reflectometry or ellipsometry measurements are performed 201 on a sample's test pattern. The values stored in the library are used to calculate 202 a theoretical optical response, which is compared 203 with the measured response. The values in the library may optionally be the desired theoretical optical response, quantities used to facilitate the calculation of such a response. Parameters are changed 204 and updated theoretical responses are calculated 202 using the library until a "best" match is found 203. The overlay (and optionally the CD and profile parameters) are then reported 205. In a further refinement, the response of the overlapping gratings can be obtained at measurement time by interpolating between discrete entries in the database, as described in pending U.S. patent application Ser. No. 09/927,177, filed Aug. 10, 2001, "Database Interpolation Method of Optical Measurement of Diffractive Structures", which is incorporated herein by reference.

In other embodiments, samples of either one or the other of the two overlying gratings used to measure overlay error is available without its mate, on some portion of the wafer. The method adds one or more steps for measuring the optical characteristics of single gratings (as opposed to overlying pairs), and possibly for measuring parameters of single gratings, to constrain the measurement of overlay error on the pair of gratings. In some cases this may involve storing the optical response characteristics from a previous process step in the fabrication of the wafer, e.g., for the lower grating in the pair of gratings.

An alternative, preferred embodiment of the method that is less sensitive to wafer-to-wafer variations in the geometric and material properties of the test structures uses, for the x direction, two gratings as shown in cross section in FIG. 21. In this approach, two spectroscopic measurements, one on test structure 210a, and another one on test structure 210b that is adjacent to 210a, yield offset along the x-axis, as discussed in detail below. The same approach is preferably applied to another direction, e.g., along the y-axis. Gratings 212a and 212b are mirror images of each other. Similarly, Gratings 214a and 214b are mirror images of each other. At least one of the gratings 212a and 214a in test pattern 210a are asymmetric. Similarly, at least one of the gratings 212b and 214b in test pattern 210b are asymmetric. There are two similar structures, not shown in FIG. 21, with the lattice dimension in the y-direction, to measure the offset along the y-axis. The geometric and material properties of test structures 210a and 210b are substantially similar because the two test structures are located close to each other and the same process steps produce them.

At perfect overlay, grating 214a is offset from grating 212a along the x-axis by $-\Delta_0$, and grating 214b is offset from grating 212b by $+\Delta_0$ along the x-axis. Hence, they are mirror images. Viewed by un-polarized reflectometry at normal incidence, e.g., by the preferred instrument, the test structures 210a and 210b have the same reflectance by symmetry. As the overlay error increases, the reflectance of the test structures 210a and 210b change differently. The difference of the reflectance spectra from 210a and 210b is indicative of the offset between the two layers. The difference is zero at perfect alignment even if the grating properties change from wafer to wafer or within the wafer, as long as they are the same for the two neighboring structures. The difference in the spectral reflectance of gratings 210a and 210b is proportional to overlay error $\Delta$ for small (on the order of 0.1 $\mu$m) overlay errors:

$$R_{10c}(\lambda, \Delta) - R_{10d}(\lambda, \Delta) \approx 2\frac{\partial R}{\partial \Delta}(\lambda)\Delta$$

The maximum likelihood estimate $\hat{\Delta}$ of overlay error assuming the above mathematical model and random zero-mean Gaussian noise is:

$$\hat{\Delta} = \frac{\sum_\lambda \left[[R_{10c}(\lambda) - R_{10d}(\lambda)]\frac{\partial R}{\partial \Delta}(\lambda)\right]}{\sum_\lambda \left[\frac{\partial R}{\partial \Delta}(\lambda)\right]^2}$$

This is one of the many possible linear estimators of overlay error. Another one, for example, is the average of the spectral difference $R_{10c}(\lambda,\Delta)-R_{10d}(\lambda,\Delta)$. Any linear functional of the spectral difference will be proportional to the alignment offset for small offsets. Once the proportionality constant is known, small offsets are rapidly calculated at measurement time. This eliminates the need for inverse diffraction calculations or searches in a pre-computed library. The proportionality constant between the norm of the spectral difference and the alignment offset is preferably determined by solving Maxwell's equations on a theoretical model of the test structure before the measurements. Alternatively, the proportionality constant can be determined empirically. Or, the proportionality constant itself can be a function of some other measured parameter or parameters on the wafer, e.g., a critical dimension, a layer thickness, or an optical property. Alternatively, the function relating the measure of the spectral difference may be a more complex function of overlay error, e.g., a polynomial or some other empirical function based on theoretical model or controlled measurements. Alternatively, the data measured at 210a and 210b, $R_{10c}(\lambda,\Delta),R_{10d}(\lambda,\Delta)$, are inverted for the overlay error simultaneously, with an algorithm similar to that described in conjunction with FIG. 20. This inversion can be more stable or more efficient than for an inversion of either or both gratings alone, since it effectively removes or de-emphasizes inversion parameters other than overlay error.

The embodiments described above for pairs of antisymmetric gratings pairs (at zero overlay) use reflectances at multiple wavelengths as the optical characteristics. Similar arrangements of gratings can be used with other optical characteristics and/or measurement instruments in yet alternative embodiments to measure overlay with reduced sensitivity to ancillary process parameters. E.g., an ellipsometer can measure the optical characteristics of the pair of grating pairs to be compared. Both grating pairs will be affected in substantially the same manner by ancillary changes, yet will be affected in opposite ways by the offsets associated with overlay error.

Alternatively, instead of using separate line gratings 10 and 20 to measure the x and y components of the overlay error, a two-dimensional grating 220 may be used as shown in FIG. 22 to obtain both x and y components of the offset simultaneously. In the preferred embodiment, at least one of the upper and lower gratings is asymmetric in both x and y directions, as shown in FIG. 22. Furthermore, the pattern is different in x and y directions; i.e., the pattern is not self similar under ±90° rotations in the plane of the wafer. In one preferred embodiment, as shown in FIG. 23, there are three gratings, an original 230a, one 230b mirrored in x, and one 230c mirrored in y, to reduce sensitivity to parameters other than overlay error. Alternatively, use of a single two-dimensional grating is possible, offering less need for real estate on the wafer.

In alternative embodiments the data contains at least one spectroscopic measurement that is not at normal incidence, i.e., $\theta\neq0$, to assist in distinguishing the two dimensions. In this case the rotation of the wafer with respect to the optical system should be controlled so that $\phi$ is controlled.

FIG. 24 shows a processing tool 240. The tool comprises at least one port 242 for loading samples to be processed, at least one robot 244 for transporting samples within the tool, at least one process module 246 for actually applying a manufacturing process to a sample, and an optical instrument 40, as described above with FIG. 4. The process module may be a lithography stepper for exposing photoresist on a wafer, a developer for developing photoresist, a bake or cool plate, a spinner, an etch chamber, a deposition chamber, or any other processing tool known in the art. In the preferred embodiment processing tool 240 is a lithography track with a stepper, and process module 246 is a photoresist developer.

Samples to be processed are loaded into port 242, and passed by robot 244 to the process module for processing. After the processing is done, robot passes the sample to optical apparatus 40, which measures at least the overlay error of the developed film relative to an underlying film. If the overlay is acceptable, the sample is returned to port 242 (or another one like it), possibly after other manufacturing steps. If the overlay is deemed unacceptable, preferably action is taken to correct the error on the measured wafer, i.e., the photoresist is stripped and the wafer is reprocessed with adjusted process parameters. Alternatively, action is taken to prevent or reduce such errors on future samples.

FIG. 12 shows the preferred embodiment of the method where the top grating 122 is composed of developed photoresist on top of TEOS layer 121 which will be etched in a following process step. The method alternatively can be applied when the top layer is resist that has been exposed by the lithography tool but not yet developed. Thus the top grating 122 would be a so-called latent image in the exposed photoresist. The latent image comprises variations in the optical properties between exposed and unexposed regions of the resist, and/or topography in the top surface due to differential shrinkage due to exposure. In many cases, the optical characterization is preferably performed after a bake process, e.g., for so-called chemically amplified resists. The advantage of using the latent image as the top grating is that errors can be discovered sooner, less process time wasted and possibly fewer samples produced with such errors.

However, the latent image does not scatter as strongly as the developed resist.

In additional embodiments, the top grating 122 may comprise an etched pattern, for example, the upper surface of TEOS layer 121 of FIG. 12 after etching. In these cases, the photoresist may or may not still be present, and there may or may not be deposits on the side walls of the etched trenches 124 and 126. These additional components are typically removed by ashing and/or wet cleaning after the etch process. It is advantageous from the timing point of view to measure the overlay error before these are removed, however, it is easier from a modeling point of view to do it afterwards.

In yet additional embodiments, as shown in FIG. 25, region 252 separating lower grating 254 and upper grating 256 may comprise optically lossy materials, so that little or no optical energy passes between the two gratings. Such situations may arise in microelectronics manufacture when patterning the intervening material 256 to form poly-silicon gates or Damascene metal interconnects. In such cases, ancillary physical properties, such as the topography of surface 258 due to the presence of underlying grating 254, provides sufficient modification of the optical characteristics to allow measurement of overlay with the same general method. If a theoretical model is used to invert the data, it would comprise, for example, the loss in region 252, the topography of surface 258, and the offset between that topography and grating 256.

The above descriptions refer to gratings. Periodic, laterally Cartesian gratings are preferred at the present time due to speed limitations of computational methods and hardware for the scattering from the structures. However, the above methods are also applicable to more general scattering structures which may be more practical when models to describe their scattering become available. Thus the above methods apply to non-periodic 'gratings', e.g., variable pitch gratings and 'single-period gratings', non-Cartesian gratings (e.g., generally circular gratings), and the like. Also, the above descriptions implied that the upper and lower gratings have the same pitch(es) and orientation. However, the methods are applicable to cases where the upper and lower gratings have different pitches and/or different orientations. For example, as computational hardware and methods advance, overlay error may be measured directly on the "device structures" on the wafer, without using specially designed test structures that are typically built in otherwise "wasted" regions, e.g., scribe lines.

What is claimed is:

1. A method of measuring alignment accuracy between two or more patterned layers formed on a substrate comprising, forming test areas as part of the patterned layers, wherein a first diffraction grating is built into a patterned layer A and a second diffraction grating is built into a patterned layer B, where layers A and B are desired to be aligned with respect to each other, zero or more layers of other materials separating layers A and B, the two gratings substantially overlapping when viewed from a direction that is perpendicular to the surfaces of A and B;

observing the overlaid diffraction gratings using an optical instrument capable of measuring any one or more of transmission, reflectance, or ellipsometric parameters as a function of any one or more of wavelength, polar angle of incidence, azimuthal angle of incidence, or polarization of the illumination and detection; and determining the offset between the gratings from the measurements from the optical instrument using an optical model, wherein the optical model accounts for the diffraction of the electromagnetic waves by the gratings and the interaction of the gratings with each other's diffracted field;

wherein at least one layer between the grating in layer A and the grating in layer B is opaque in the wavelength range of the optical instrument, and the presence of the grating in layer A causes a grating-shaped topography on the surface of the opaque layer.

2. A method of measuring alignment accuracy between two or more patterned layers formed on a substrate comprising, forming test areas as part of the patterned layers, wherein a first diffraction grating is built into a patterned layer A and a second diffraction grating is built into a patterned layer B, where layers A and B are desired to be aligned with respect to each other, zero or more layers of other materials separating layers A and B, the two gratings substantially overlapping when viewed from a direction that is perpendicular to the surfaces of A and B;

observing the overlaid diffraction gratings using an optical instrument capable of measuring any one or more of transmission, reflectance, or ellipsometric parameters as a function of any one or more of wavelength, polar angle of incidence, azimuthal angle of incidence, or polarization of the illumination and detection; and determining the offset between the gratings from the measurements from the optical instrument using an optical model, wherein the optical model accounts for the diffraction of the electromagnetic waves by the gratings and the interaction of the gratings with each other's diffracted field;

wherein the optical model represents the electromagnetic field in the gratings and in the layers between the gratings as a sum of more than one diffracted orders.

3. A method of measuring alignment accuracy between two or more patterned layers formed on a substrate comprising, forming test areas as part of the patterned layers, wherein a first diffraction grating is built into a patterned layer A and a second diffraction grating is built into a patterned layer B, where layers A and B are desired to be aligned with respect to each other, zero or more layers of other materials separating layers A and B, the two gratings substantially overlapping when viewed from a direction that is perpendicular to the surfaces of A and B;

observing the overlaid diffraction gratings using an optical instrument capable of measuring any one or more of transmission, reflectance, or ellipsometric parameters as a function of any one or more of wavelength, polar angle of incidence, azimuthal angle of incidence, or polarization of the illumination and detection; and determining the offset between the gratings from the measurements from the optical instrument using an optical model, wherein the optical model accounts for the diffraction of the electromagnetic waves by the gratings and the interaction of the gratings with each other's diffracted field;

wherein offset is determined by;

calculating, according to a model of a wafer sample, the optical response of the sample with the said two overlapping gratings, the model of the sample taking into account parameters of the sample including any of the overlay misalignment of layers A and B, the profiles of the grating structures, and asymmetries caused in the grating structures by manufacturing processes;

changing the parameters of the sample model to minimize the difference between the calculated and measured optical responses; and repeating the previous two steps until the difference between the calculated and measured optical responses is sufficiently small or cannot be significantly decreased by further iterations.

4. The method of claim 3 wherein at least a portion of the calculation is done at the measurement time.

5. The method of claim 3 wherein at least a portion of the calculated optical response is retrieved from a pre-computed database.

6. The method of claim 3 wherein the calculation involves interpolating the optical response from pre-computed entries in a database.

7. A method of measuring alignment accuracy between two or more patterned layers formed on a substrate comprising, forming test areas as part of the patterned layers, wherein a first diffraction grating is built into a patterned layer A and a second diffraction grating is built into a patterned layer B, where layers A and B are desired to be aligned with respect to each other, zero or more layers of other materials separating layers A and B, the two gratings substantially overlapping when viewed from a direction that is perpendicular to the surfaces of A and B;

observing the overlaid diffraction gratings using an optical instrument capable of measuring any one or more of transmission, reflectance, or ellipsometric parameters as a function of any one or more of wavelength, polar angle of incidence, azimuthal angle of incidence, or polarization of the illumination and detection; and determining the offset between the gratings from the measurements from the optical instrument using an optical model, wherein the optical model accounts for the diffraction of the electromagnetic waves by the gratings and the interaction of the gratings with each other's diffracted field;

wherein the first and second diffraction gratings have different pitches.

8. A method of measuring alignment accuracy between two or more patterned layers formed on a substrate comprising:

forming test areas as part of the patterned layers, wherein a first diffraction grating is built into a patterned layer A and a second diffraction grating is built into a patterned layer B, where layers A and B are desired to be aligned with respect to each other, zero or more layers of other materials separating layers A and B, the two gratings substantially overlapping when viewed from a direction that is perpendicular to the surfaces of A and B, observing the overlaid diffraction gratings using an optical instrument capable of measuring any one or more of transmission, reflectance, or ellipsometric parameters as a function of any one or more of wavelength, polar angle of incidence, azimuthal angle of incidence, or polarization of the illumination and detection; and determining the offset between the gratings from the measurements from the optical instrument using an optical model, wherein the optical model accounts for the diffraction of the electromagnetic waves by the gratings and the interaction of the gratings with each other's diffracted field;

wherein at least one of the two gratings contains more than one line per pitch, the widths of the at least two lines in each pitch being substantially different from each other.

9. A method of determining a degree of registration between an upper layer and a lower layer formed on a substrate, each of said layers including a periodic structure formed thereon and arranged to at least partially overlap, said method comprising the steps of:

illuminating the layers with a probe beam of radiation;

monitoring the zeroth order light diffracted from the layers;

generating a parameterized model representing the geometry and registration of parameters of the model; and comparing the predicted optical response with the monitored zeroth order light to determine the registration of the structures.

10. A method as recited in claim 9 wherein said predicting step is at least partially carried out in advance for a number of different parameters and wherein the corresponding responses are stored in a database for later comparison with the monitored response.

11. A method as recited in claim 9 wherein the predicting and comparing steps are repeated while changing the parameters used in the predicting step in order to cause the predicted optical response to converge with the monitored response.

12. A method as recited in claim 9 wherein said probe beam is generated from a broadband source and said monitoring step is carried out as function of wavelength.

13. An apparatus for determining overlay error between two or more patterned layers of a sample, comprising, a metrology target comprising a first diffraction grating built into a patterned layer A and a second diffraction grating built into a patterned layer B, where layers A and B are part of the sample under test and layers A and B are desired to be aligned with respect to each other, the two gratings substantially overlapping when viewed from a direction that is perpendicular to the layers A and B;

an optical instrument that illuminates part or all of the metrology target and that measures properties of light that has interacted with the metrology target as a function of any one or more of polar angle of incidence, azimuthal angle of incidence, and polarization of the illumination and detection; and a processor which estimates the offset of the grating pair from the measured properties;

wherein the first and second diffraction gratings have different pitches.

14. An apparatus for determining overlay error between two or more patterned layers of a samples comprising:

a metrology target comprising a first diffraction grating built into a patterned layer A and second diffraction grating built into a patterned layer B, where layers A and B are part of the sample under test and layers A and B are desired to be aligned with respect to each other, the two gratings substantially overlapping when viewed from a direction that is perpendicular to the layers A and B;

an optical instrument that illuminates part or all of the metrology target and that measures properties of light that has interacted with the metrology target as a function of any one or more of polar angle of incidence, azimuthal angle of incidence, and polarization of the illumination and detection; and a processor which estimates the offset of the grating pair form the measured properties;

wherein at least one of the two gratings contains more than one line per pitch, the widths of the at least two lines in each pitch being substantially different from each other.

15. An apparatus for determining overlay error between two or more patterned layers of a sample, comprising, a metrology target comprising a first diffraction grating built into a patterned layer A and a second diffraction grating built into a patterned layer B, where layers A and B are part of the sample under test and layers A and B are desired to be aligned with respect to each other, the two gratings substantially overlapping when viewed from a direction that is perpendicular to the layers A and B;

an optical instrument that illuminates part or all of the metrology target and that measures properties of light that has interacted with the metrology target as a function of any one or more of polar angle of incidence, azimuthal angle of incidence, and polarization of the illumination and detection; and a processor which estimates the offset of the grating pair from the measured properties;

wherein at least one other layer of material separates layers A and B at the metrology target.

16. An apparatus for determining overlay error between two or more patterned layers of a sample, comprising, a metrology target comprising a first diffraction grating built into a patterned layer A and a second diffraction grating built into a patterned layer B, where layers A and B are part of the sample under test and layers A and B are desired to be aligned with respect to each other, the two gratings substantially overlapping when viewed from a direction that is perpendicular to the layers A and B;

an optical instrument that illuminates part or all of the metrology target and that measures properties of light that has interacted with the metrology target as a function of any one or more of polar angle of incidence, azimuthal angle of incidence, and polarization of the illumination and detection; and a processor which estimates the offset of the grating pair from the measured properties:

wherein the processor has been programmed to iteratively (i) calculate an optical response for a set of sample parameters, including overlay misalignment, (ii) compare the measured properties with the calculated optical response, and (iii) change one or more sample parameters so as to minimize the difference between the measured properties and the calculated optical response, wherein the calculation of an optical response is according to an optical model of the sample that accounts for the diffraction of electromagnetic waves by the pair of gratings of the metrology target and the interaction of the gratings with each other's diffracted field.

17. The apparatus of claim 16 wherein the processor has access to a pre-computed database from which at least a portion of the calculated optical response can be retrieved.

18. The apparatus of claim 17 wherein the calculation performed by the programmed processor involves interpolating the optical response from pre-computed entries in said database.

19. An apparatus for determining the overlay error comprising, a metrology target comprising a first diffraction grating built into a patterned layer A and a second diffraction grating is built into a patterned layer B, where layers A and B are desired to be aligned with respect to each other, the two gratings substantially overlapping when viewed from a direction that is perpendicular to the layers A and B;

an ellipsometer that illuminates part or all of the metrology target and that measures properties of light that has interacted with the metrology target; and a processor which estimates the offset of the grating pair from the pair's measured optical characteristics.

20. The method of claim 19 wherein first and second diffraction gratings have different pitches.

21. The apparatus of claim 19 wherein at least one of the two gratings contains more than one line per pitch, the widths of the at least two lines in each pitch (unit cell) being substantially different from each other.

22. The apparatus of claim 19 wherein at least one other layer of material separates layers A and B at the metrology target.

23. The apparatus of claim 19 wherein the ellipsometer measures properties of light that has interacted with the metrology target as a function of wavelength.

24. The apparatus of claim 19 wherein the processor has been programmed to iteratively (i) calculate an optical response for a set of sample parameters, including overlay misalignment, (ii) compare the measured properties with the calculated optical response, and (iii) change one or more sample parameters so as to minimize the difference between the measured properties and the calculated optical response, wherein the calculation of an optical response is according to an optical model of the sample that accounts for the diffraction of electromagnetic waves by the pair of gratings of the metrology target and the interaction of the gratings with each other's diffracted field.

25. The apparatus of claim 24 wherein the processor has access to a pre-computed database from which at least a portion of the calculated optical response can be retrieved.

26. The apparatus of claim 25 wherein the calculation performed by the programmed processor involves interpolating the optical response from pre-computed entries in said database.

27. The apparatus of claim 19, wherein the metrology target further includes a second pattern built into layers A and B, and wherein the optical instrument further includes a camera disposed to observe said second pattern and obtain measurements therefrom of any gross overlay errors, said processor connected to also receive said measurements from said camera.

28. The apparatus of claim 27, wherein said second pattern comprises a box-in-box pattern.

29. The apparatus of claim 27, wherein said second pattern comprises a bar-in-bar pattern.

30. A method of measuring alignment accuracy between two or more patterned layers formed on a substrate comprising, forming test areas as tart of the patterned layers, wherein a first diffraction grating is built into a patterned layer A and a second diffraction grating is built into a patterned layer B, where layers A and B are desired to be aligned with respect to each other, zero or more layers of other materials separating layers A and B, the two gratings substantially overlapping when viewed from a direction that is perpendicular to the surfaces of A and B;

observing the overlaid diffraction gratings using an optical instrument capable of measuring any one or more of transmission, reflectance, or ellipsometric parameters as a function of any one or more of wavelength, polar angle of incidence, azimuthal angle of incidence, or polarization of the illumination and detection;

determining the offset between the gratings from the measurements from the optical instrument using an optical model, wherein the optical model accounts for the diffraction of the electromagnetic waves by the gratings and the interaction of the gratings with each other's diffracted field; and observing at least one second test area on said substrate using a camera, the second test area having a pattern built into layers A and B for measuring any gross overlay errors, and wherein determining the offset includes using gross overlay measurements obtained from the camera;

wherein said pattern in said second area comprises a bar-in-bar pattern.

31. An apparatus for determining overlay error between two or more patterned layers of a sample, comprising:

a metrology target comprising a first diffraction grating built into a patterned layer A and a second diffraction grating built into a patterned layer B, where layers A and B are part of the sample under test and layers A and B are desired to be aligned with respect to each other, the two gratings substantially overlapping when viewed from a direction that is perpendicular to the layers A and B;

an optical instrument that illuminates part or all of the metrology target and that measures properties of light that has interacted with the metrology target as a function of any one or more of polar angle of incidence, azimuthal angle of incidence, and polarization of the illumination and detection; and a processor which estimates the offset of the grating pair from the measured properties;

wherein the metrology target further includes a second pattern built into layers A and B, and wherein the optical instrument further includes a camera disposed to observe said second pattern and obtain measurements therefrom of any gross overlay errors, said processor connected to also receive said measurements from said camera; and wherein said second pattern comprises a bar-in-bar pattern.

* * * * *